(12) United States Patent
Sasaki et al.

(10) Patent No.: US 11,089,679 B2
(45) Date of Patent: Aug. 10, 2021

(54) PRINTED WIRING BOARD AND METHOD FOR MANUFACTURING PRINTED WIRING BOARD

(71) Applicant: Mitsubishi Electric Corporation, Tokyo (JP)

(72) Inventors: Shunsuke Sasaki, Tokyo (JP); Kohei Sato, Tokyo (JP); Yusuke Morimoto, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/909,339

(22) Filed: Jun. 23, 2020

(65) Prior Publication Data
US 2020/0323079 A1  Oct. 8, 2020

Related U.S. Application Data

(63) Continuation of application No. 16/485,349, filed as application No. PCT/JP2017/035907 on Oct. 3, 2017, now Pat. No. 10,757,807.

(30) Foreign Application Priority Data

Mar. 2, 2017 (JP) .................. 2017-039327

(51) Int. Cl.
    *H05K 1/14*    (2006.01)
    *H05K 1/11*    (2006.01)
    *H05K 3/34*    (2006.01)

(52) U.S. Cl.
    CPC .............. *H05K 1/111* (2013.01); *H05K 1/14* (2013.01); *H05K 3/34* (2013.01);
(Continued)

(58) Field of Classification Search
CPC ................ H05K 1/14–142; H05K 1/144–147
See application file for complete search history.

(56) References Cited

U.S. PATENT DOCUMENTS 5,754,411 A     5/1998   Woychik
10,608,359 B2 *   3/2020   Kim ................... H01R 12/7023
(Continued)

FOREIGN PATENT DOCUMENTS

JP     S57-008772 U    1/1982
JP     H02-049166 U    4/1990
(Continued)

OTHER PUBLICATIONS

Office Action (Decision of Refusal) dated Jun. 30, 2020, by the Japanese Patent Office in corresponding Japanese Patent Application No. 2019-502449 and English translation of the Office Action. (7 pages).

(Continued)

*Primary Examiner* — Jeremy C Norris
(74) *Attorney, Agent, or Firm* — Buchanan Ingersoll & Rooney PC

(57) ABSTRACT

A printed wiring board includes a main substrate and a rising substrate. A support portion of the rising substrate is inserted into a slit in the main substrate. In a direction in which a plurality of first electrodes are aligned, a width of each of the plurality of first electrodes is larger than a width of each of a plurality of second electrodes, and the width of each of the plurality of second electrodes is arranged to fit within the width of each of the plurality of first electrodes.

12 Claims, 29 Drawing Sheets

(52) U.S. Cl.
CPC .............. *H05K 2201/0305* (2013.01); *H05K 2201/0367* (2013.01); *H05K 2203/041* (2013.01)

(56) References Cited

U.S. PATENT DOCUMENTS

| | | | |
|---|---|---|---|
| 10,757,807 B2 * | 8/2020 | Sasaki | .................... H05K 3/34 |
| 2006/0049777 A1 | 3/2006 | Kumagai et al. | |
| 2006/0220636 A1 | 10/2006 | Satoh | |
| 2007/0197058 A1 | 8/2007 | Kitada et al. | |
| 2011/0149543 A1 | 6/2011 | Kamoi et al. | |
| 2011/0305852 A1 | 12/2011 | Sugaya | |
| 2012/0212920 A1 | 8/2012 | Schreffler | |
| 2019/0380202 A1 | 12/2019 | Sasaki et al. | |

FOREIGN PATENT DOCUMENTS

| | | |
|---|---|---|
| JP | H05-063326 A | 3/1993 |
| JP | H05259601 A | 10/1993 |
| JP | H0645369 U | 6/1994 |
| JP | 2006-279485 A | 10/2006 |
| JP | 2007220961 A | 8/2007 |
| JP | 4314809 B2 | 5/2009 |
| JP | 2011-086664 A | 4/2011 |
| JP | 2011253835 A | 12/2011 |
| JP | 2014236091 A | 12/2014 |
| JP | 2017017089 A | 1/2017 |
| WO | 2016185559 A1 | 11/2016 |
| WO | 2017002720 A1 | 1/2017 |

OTHER PUBLICATIONS

International Search Report (PCT/ISA/210) dated Jan. 9, 2018, by the Japan Patent Office as the International Searching Authority for International Application No. PCT/JP2017/035907.

Written Opinion (PCT/ISA/237) dated Jan. 16, 2018, by the Japan Patent Office as the International Searching Authority for International Application No. PCT/JP2017/035907.

Extended European Search Report dated Feb. 12, 2020, issued by the European Patent Office in corresponding European Application No. 17898560.2. (9 pages).

Office Action (Notice of Reasons for Refusal) dated Feb. 12, 2020, by the Japanese Patent Office in corresponding Japanese Patent Application No. 2019-502449 and English translation of the Office Action. (8 pages).

* cited by examiner

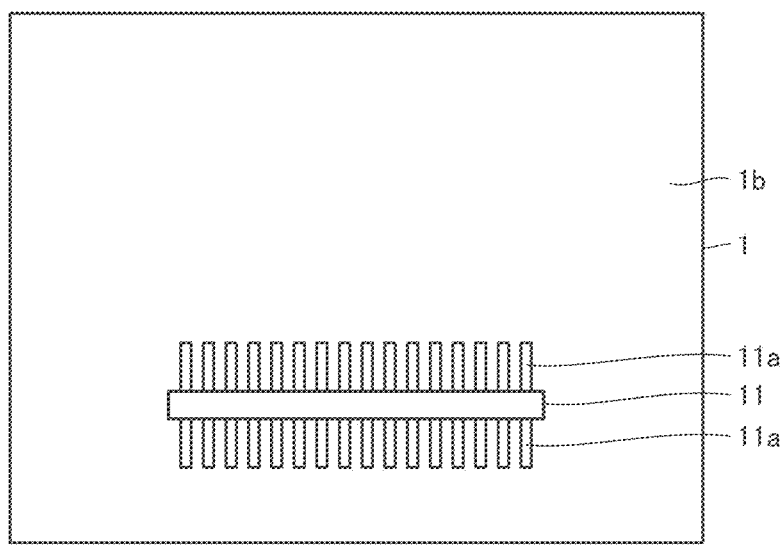
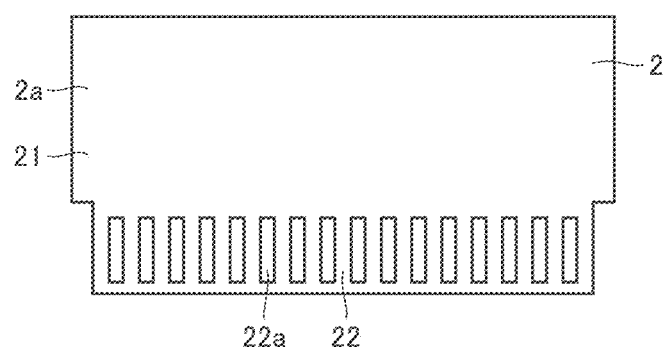

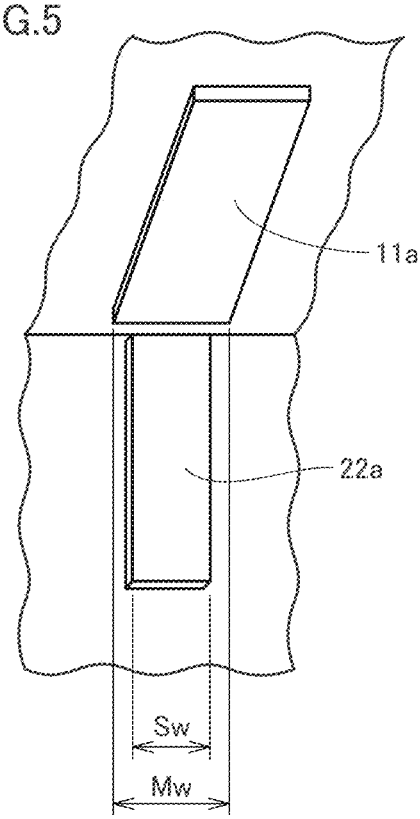

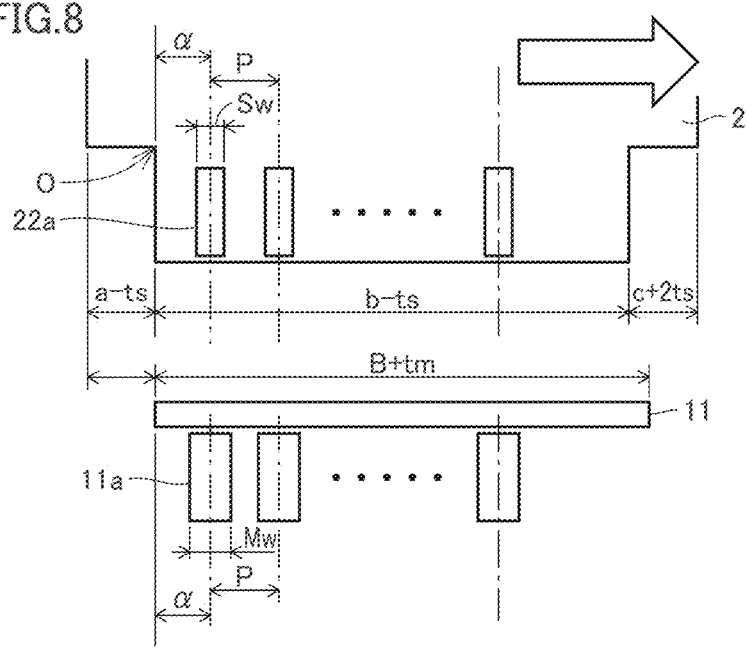
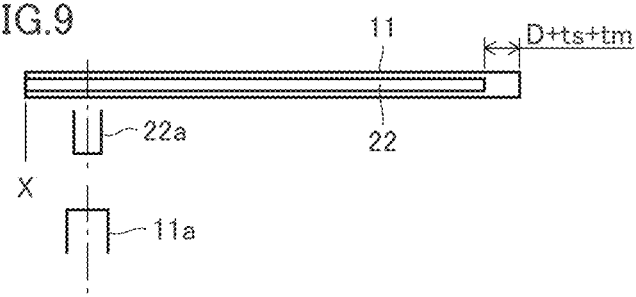

US 11,089,679 B2

PRINTED WIRING BOARD AND METHOD FOR MANUFACTURING PRINTED WIRING BOARD

CROSS REFERENCE TO RELATED APPLICATIONS

This application is a continuation of U.S. application Ser. No. 16/485,349, filed Aug. 12, 2019, which is a U.S. National Phase Application of International Application No. PCT/JP2017/035907, filed Oct. 3, 2017, each incorporated herein by reference in its entirety.

TECHNICAL FIELD

The present invention relates to a printed wiring board, and in particular to a printed wiring board including a main substrate and a rising substrate.

BACKGROUND ART

An electronic device having a rising substrate attached to a main substrate is described, for example, in Japanese Patent No. 4314809 (PTL 1). In this electronic device, an auxiliary substrate (rising substrate) is inserted into a slit provided in a mother substrate (main substrate), and terminal pads (electrodes) of the rising substrate are soldered to terminal pads (electrodes) of the main substrate.

CITATION LIST

Patent Literature

PTL 1: Japanese Patent No. 4314809

SUMMARY OF INVENTION

Technical Problem

In the electronic device having the rising substrate attached to the main substrate described in the above publication, misalignment between the electrodes of the main substrate and the electrodes of the rising substrate may occur due to dimensional tolerances caused during manufacturing of the substrates. In this case, the amount of solder of a solder joint is smaller than that when the misalignment does not occur. Thus, rupture of the solder joint occurs in a short time due to a strain resulting from a temperature cycle under a usage environment.

The present invention has been made in view of the aforementioned problem, and an object thereof is to provide a printed wiring board capable of suppressing occurrence of rupture of a solder joint in a short time.

Solution to Problem

A printed wiring board of the present invention includes a main substrate and a rising substrate. The main substrate has a top surface, a bottom surface, a slit penetrating from the top surface to the bottom surface, and a plurality of first electrodes provided on the bottom surface. The rising substrate has a support portion and a plurality of second electrodes provided in the support portion and connected to the plurality of first electrodes, respectively, using solder. The support portion of the rising substrate is inserted into the slit in the main substrate. In a direction in which the plurality of first electrodes are aligned, a width of each of the plurality of first electrodes is larger than a width of each of the plurality of second electrodes, and the width of each of the plurality of second electrodes is arranged to fit within the width of each of the plurality of first electrodes.

Advantageous Effects of Invention

According to the printed wiring board of the present invention, the width of each of the plurality of first electrodes is larger than the width of each of the plurality of second electrodes, and the width of each of the plurality of second electrodes is arranged to fit within the width of each of the plurality of first electrodes. Thus, a solder joint is reliably formed with the width of the second electrode. Therefore, this can prevent the amount of solder of the solder joint from being decreased because the width of the solder joint is smaller than the width of the second electrode. This can prevent occurrence of rupture of the solder joint in a short time due to a strain resulting from a temperature cycle under a usage environment.

BRIEF DESCRIPTION OF DRAWINGS

FIG. 3 is a bottom view schematically showing a configuration of the main substrate in the first embodiment of the present invention.

FIG. 4 is a front view schematically showing a configuration of the rising substrate in the first embodiment of the present invention.

FIG. 5 is an enlarged perspective view showing the positional relation between a first electrode provided on the main substrate and a second electrode provided on the rising substrate in the first embodiment of the present invention.

FIG. 8 is a schematic view for illustrating a configuration in which the rising substrate has a minimum dimension and the main substrate has a maximum dimension in the first embodiment of the present invention.

FIG. 9 is a schematic view for illustrating the slit and the support portion in the configuration in which the rising substrate has the minimum dimension and the main substrate has the maximum dimension in the first embodiment of the present invention.

DESCRIPTION OF EMBODIMENTS

Hereinafter, embodiments of the present invention will be described based on the drawings.

First Embodiment

Figure 1:
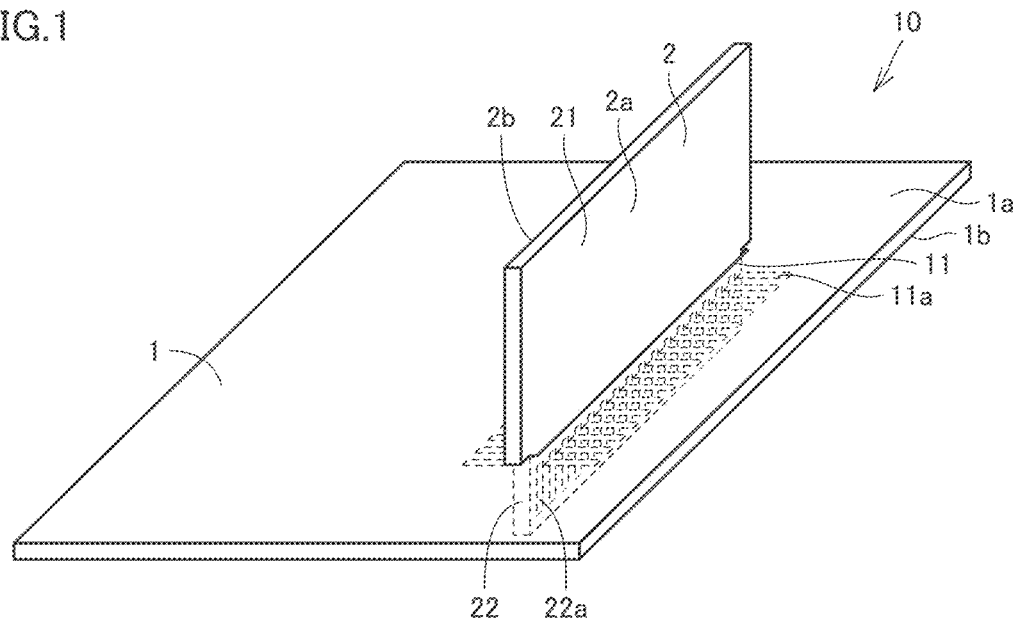
FIG. 1 is a perspective view schematically showing a configuration in which a rising substrate is mounted in a main substrate in a first embodiment of the present invention.
Figure 2:
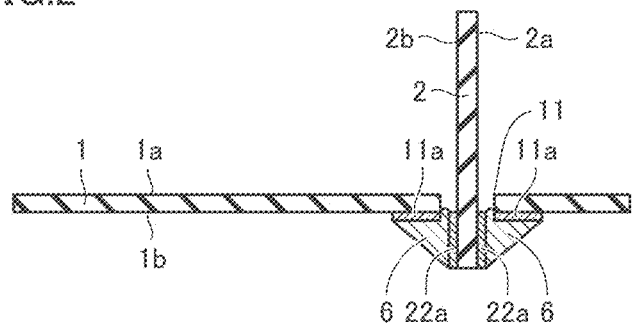
FIG. 2 is a cross sectional view schematically showing the configuration in which the rising substrate is mounted in the main substrate in the first embodiment of the present invention.

A configuration of a printed wiring board 10 in a first embodiment of the present invention will be described with reference to FIGS. 1 to 5. Printed wiring board 10 in the present embodiment is a three-dimensional printed wiring board. FIG. 1 is a perspective view showing printed wiring board 10 in the present embodiment. FIG. 2 is a cross sectional view showing a state where a rising substrate 2 is mounted in a main substrate 1. FIG. 3 is a bottom view showing a bottom surface 1b of main substrate 1. FIG. 4 is a front view showing a front surface 2a of rising substrate 2.

As shown in FIGS. 1 and 2, printed wiring board 10 in the present embodiment includes main substrate 1 and rising substrate 2. Main substrate 1 has a top surface 1a, bottom surface 1b, a slit 11, and a plurality of first electrodes 11a. Rising substrate 2 is connected to main substrate 1 to rise from top surface 1a of main substrate 1. Rising substrate 2 has front surface 2a, a rear surface 2b, a body portion 21, a support portion 22, and a plurality of second electrodes 22a.

Slit 11 in main substrate 1 is provided to penetrate from top surface 1a to bottom surface 1b of main substrate 1. Slit 11 is provided at a position corresponding to support portion 22 of rising substrate 2. Slit 11 may be provided by press working using a metal mold.

As shown in FIGS. 2 and 3, the plurality of first electrodes 11a are provided on bottom surface 1b of main substrate 1. The plurality of first electrodes 11a are arranged to be aligned in a longitudinal direction of slit 11 at regular spacings. The plurality of first electrodes 11a are arranged with slit 11 being sandwiched therebetween in a short direction of slit 11. That is, the plurality of first electrodes 11a are arranged on both of one side and the other side in the short direction of slit 11.

Main substrate 1 is made of a common printed wiring board material. Specifically, main substrate 1 is made of, for example, CEM-3 (Composite epoxy material-3), which is a laminate produced by using a glass nonwoven fabric impregnated with a fire-resistant epoxy resin for a core of a base material, and using a prepreg formed of a glass fabric and an epoxy resin for surfaces to provide reinforced strength.

As shown in FIGS. 1 and 4, body portion 21 of rising substrate 2 is connected to support portion 22. Body portion 21 protrudes on one side and the other side of support portion 22. Body portion 21 protrudes on both sides in a longitudinal direction of support portion 22. Body portion 21 protrudes on both sides of slit 11 in the longitudinal direction of slit 11. Electronic components are mounted in body portion 21. These electronic components are a power semiconductor device, a transformer, and the like, for example.

Support portion 22 of rising substrate 2 is provided to protrude downward from body portion 21 at a lower portion of rising substrate 2. The plurality of second electrodes 22a are provided in support portion 22. The plurality of second electrodes 22a are arranged to be aligned in the longitudinal direction of support portion 22 at regular spacings.

As shown in FIGS. 1 and 2, support portion 22 of rising substrate 2 is inserted into slit 11 in main substrate 1. The plurality of second electrodes 22a are arranged at positions corresponding to the plurality of first electrodes 11a, respectively. The plurality of second electrodes 22a are provided on both of front surface 2a and rear surface 2b. The plurality of second electrodes 22a are connected to the plurality of first electrodes 11a, respectively, using solder 6. By soldering the plurality of second electrodes 22a to first electrodes 11a, rising substrate 2 is electrically connected to main substrate 1.

Rising substrate 2 is made of a common printed wiring board material. Specifically, rising substrate 2 is made of, for example, CEM-3, which is a laminate produced by using a glass nonwoven fabric impregnated with a fire-resistant epoxy resin for a core of a base material, and using a prepreg formed of a glass fabric and an epoxy resin for surfaces to provide reinforced strength.

As shown in FIGS. 1 and 5, in a direction in which the plurality of first electrodes 11a are aligned, one width of a width Mw of each of the plurality of first electrodes 11a and a width Sw of each of the plurality of second electrodes 22a is larger than the other width. The other width is arranged to fit within the one width of width Mw of each of the plurality of first electrodes 11a and width Sw of each of the plurality of second electrodes 22a. That is, in the short direction of slit 11, each of the plurality of first electrodes 11a overlaps with each of the plurality of second electrodes 22a by a smaller width of the widths of first electrode 11a and second electrode 22a. In other words, width Sw of second electrode 22a does not extend beyond width Mw of first electrode 11a.

In the present embodiment, width Mw of each of the plurality of first electrodes 11a is larger than width Sw of each of the plurality of second electrodes 22a. In addition, width Sw of each of the plurality of second electrodes 22a is arranged to fit within width Mw of each of the plurality of first electrodes 11a. That is, in the short direction of slit 11, each of the plurality of second electrodes 22a overlaps with each of the plurality of first electrodes 11a by width Sw of second electrode 22a.

The width of first electrode 11a of main substrate 1, the width of second electrode 22a of rising substrate 2, and the like will be described in further detail with reference to FIGS. 6 to 9.

Figure 6:
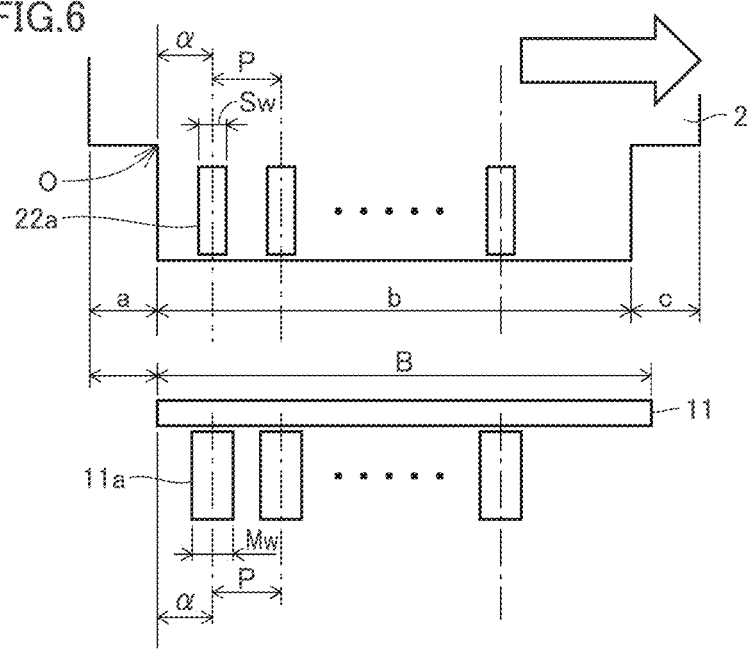
FIG. 6 is a schematic view for illustrating a configuration of the main substrate and the rising substrate having design values in the first embodiment of the present invention.
Figure 7:
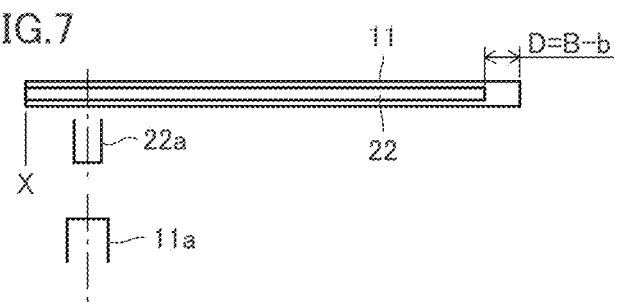
FIG. 7 is a schematic view for illustrating a configuration of a slit and a support portion having design values in the first embodiment of the present invention.

As shown in FIGS. 6 and 7, the width and the position of each of first electrode 11a and second electrode 22a are designed such that, based on a certain determined origin O, the center (center in a width direction) of first electrode 11a matches the center of second electrode 22a. Origin O is, for example, a position where support portion 22 overlaps with slit 11 on a rear side in a flow direction. The white arrow in FIG. 6 indicates the flow direction, that is, a direction in which main substrate 1 moves. It should be noted that the white arrows in the drawings subsequent to FIG. 6 also indicate the flow direction (the direction in which main substrate 1 moves).

On this occasion, the width of first electrode 11a is larger than the width of second electrode 22a such that an overlapping width between first electrode 11a and second electrode 22a is equal to the width of second electrode 22a, even in a combination of a case where slit 11 has a maximum length in the longitudinal direction and a case where support portion 22 has a minimum length in the longitudinal direction, considering the influence of misalignment which may occur due to dimensional tolerances.

Here, details of each design value thereof will be described.

First, a case where the substrates have design values (nominal values) will be described with reference to FIGS. 6 and 7.

As shown in FIG. 6, width Sw of second electrode 22a and width Mw of first electrode 11a have a relation Mw>Sw. Portions of rising substrate 2 have dimensions a, b, and c, where a is a width of body portion 21 protruding from support portion 22 on one end side of rising substrate 2, b is a width of support portion 22, and c is a width of body portion 21 protruding from support portion 22 on the other end side of rising substrate 2. Slit 11 in main substrate 1 has a dimension B in the longitudinal direction.

First electrode 11a and second electrode 22a are designed such that, when rising substrate 2 is caused to flow by jet solder during flow soldering and contacts slit 11 at an X portion, the center of first electrode 11a of main substrate 1 matches the center of second electrode 22a of rising substrate 2, at a position having a distance α from the origin. First electrodes 11a and second electrodes 22a are designed to be aligned at a pitch P. On this occasion, as shown in FIG. 7, a gap between slit 11 and support portion 22 is indicated by D. It should be noted that X portion is a portion where main substrate 1 contacts rising substrate 2.

Next, a case where rising substrate 2 has a minimum dimension and main substrate 1 has a maximum dimension will be described with reference to FIGS. 8 and 9.

Values of plus/minus tolerances in processing rising substrate 2 and slit 11 are indicated by ts and tm, respectively. On this occasion, each portion has a dimension as shown in FIG. 8.

Here, a tolerance in forming the electrodes during manufacturing of the substrates is neglected, and it is assumed that the values of α, Sw, Mw, and P remain unchanged. Thus, when rising substrate 2 is caused to flow by a jet during flow soldering and contacts slit 11 at X portion, the center of second electrode 22a of rising substrate 2 matches the center of first electrode 11a of main substrate 1, at a position having distance α from origin O.

On this occasion, the gap is indicated by D shown in FIG. 9.

When the value of (Mw−Sw)/2 is more than or equal to the value of D+ts+tm, first electrode 11a can reliably overlap with second electrode 22a by the width of Sw even if rising substrate 2 is misaligned within slit 11.

Here, it is generally satisfactory to assume that the tolerance in forming the electrodes during manufacturing of the substrates, which is neglected above, is more than or equal to 0.05 mm.

Thus, when the above relation is expressed by an expression, the present embodiment satisfies an expression (1):

$$(Mw-Sw)/2 \geq D+ts+tm \geq 0.05 \quad (1).$$

In addition, in the present embodiment, pitch P between the plurality of first electrodes 11a and between the plurality of second electrodes 22a, one larger width Mw and the other smaller width Sw of each of the plurality of first electrodes 11a and each of the plurality of second electrodes 22a, and value D obtained by subtracting the length of support portion 22 from the length of slit 11 in a direction in which slit 11 extends have a relation P/2>(Mw−Sw)/2≥D.

Figure 55:
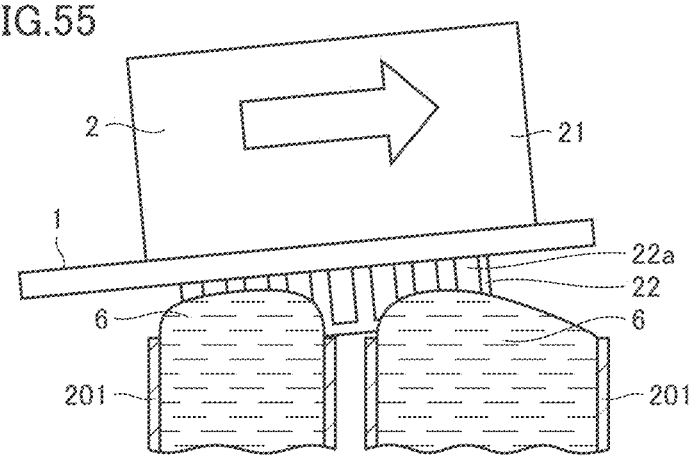
FIG. 55 is a schematic cross sectional view for illustrating a method for manufacturing the printed wiring board in the first embodiment of the present invention.

Next, a method for manufacturing the printed wiring board in the present embodiment will be described with reference to FIGS. 2, 10, and 55.

As shown in FIG. 2, with support portion 22 being vertically inserted into slit 11, first electrodes 11a of main substrate 1 and second electrodes 22a of rising substrate 2 are soldered with each other. For example, the electrodes of main substrate 1 and rising substrate 2 transported by a conveyor with rising substrate 2 being attached to main substrate 1 are soldered with each other by a flow soldering method in which the electrodes are immersed in a molten solder jet and are soldered. Thereby, first electrodes 11a are soldered and fixed to second electrodes 22a.

Figure 10:
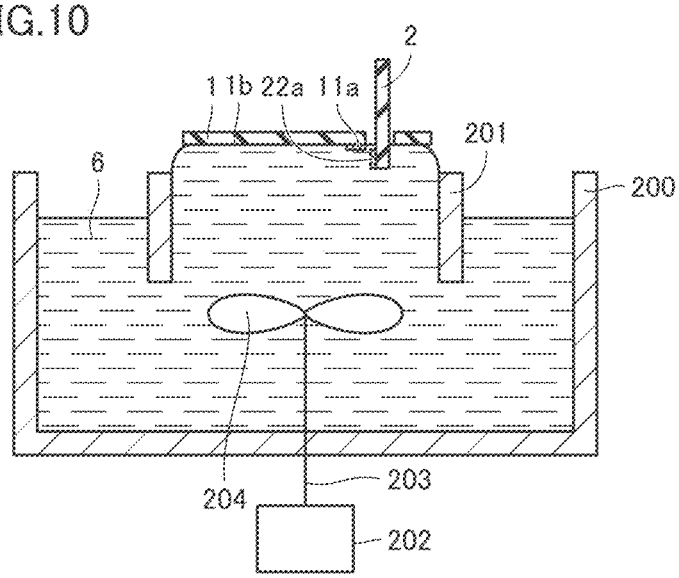
FIG. 10 is a schematic cross sectional view for illustrating a method for manufacturing a printed wiring board in the first embodiment of the present invention.

Specifically, as shown in FIG. 10, molten solder 6 stored in a solder bath 200 jets upward from a flow soldering nozzle 201, as a drive force of a motor 202 is transmitted to a propeller 204 via a motor shaft 203 and rotates propeller 204. On this occasion, it is often performed to jet molten solder 6 with different shapes from a plurality of flow soldering nozzles 201, as shown in FIG. 55, to obtain stable solder joints. Bottom surface 1b of main substrate 1 is arranged above flow soldering nozzles 201. Bottom surface 1b of main substrate 1 is immersed in jet solder. Thereby, the plurality of second electrodes 22a are soldered to the plurality of first electrodes 11a, respectively.

Next, the function and effect in the present embodiment will be described as compared with a comparative example.

Figure 11:
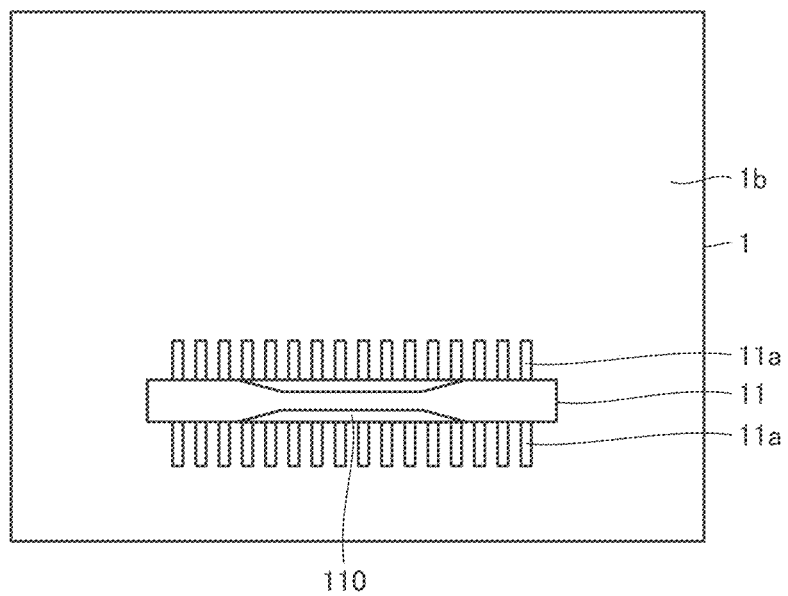
FIG. 11 is a bottom view schematically showing a configuration of a main substrate in a comparative example.

A printed wiring board in the comparative example will be described with reference to FIGS. 11 to 14. As shown in FIG. 11, in the printed wiring board in the comparative example, a tapered portion 110 is provided within slit 11. Due to this tapered portion 110, slit 11 partially has a smaller opening dimension. Rising substrate 2 is held in slit 11 in main substrate 1 by being supported by tapered portion 110. In this state, first electrodes 11a are soldered to second electrodes 22a by flow soldering.

Figure 12:
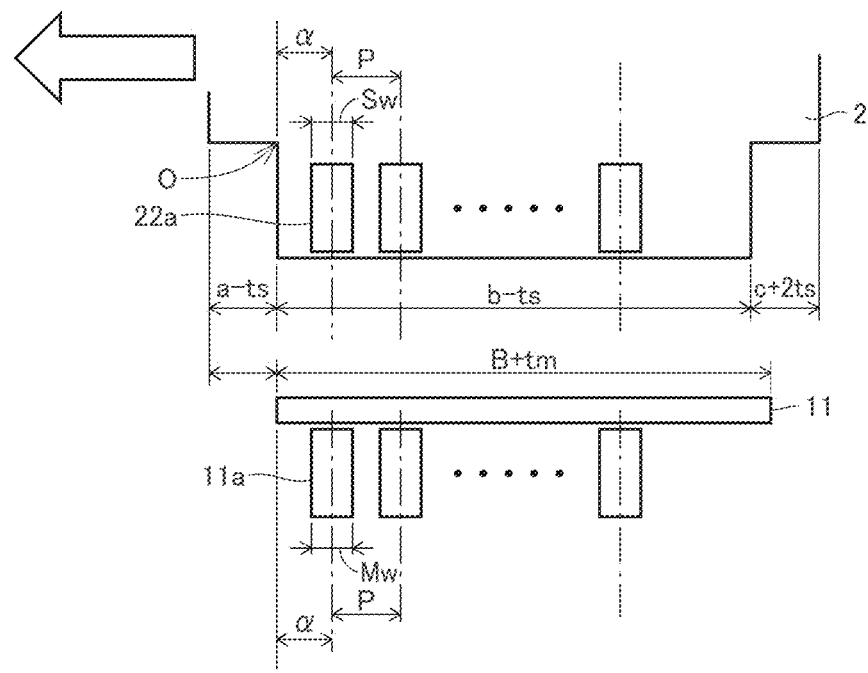
FIG. 12 is a schematic view for illustrating a configuration of the main substrate and a rising substrate in the comparative example.
Figure 13:
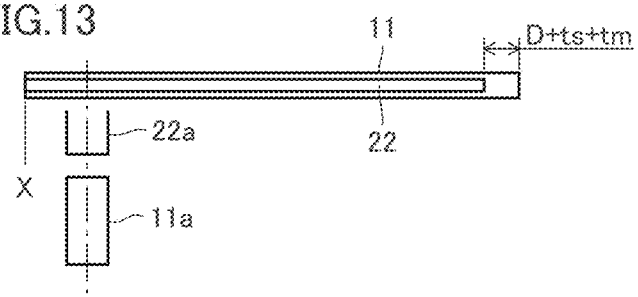
FIG. 13 is a schematic view for illustrating a configuration of the main substrate and the rising substrate in the comparative example.
Figure 14:
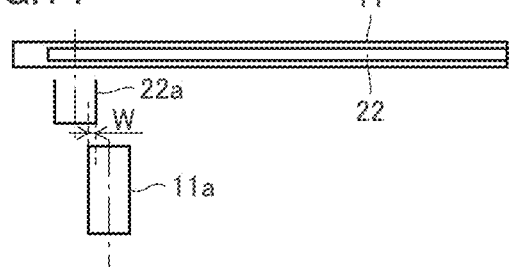
FIG. 14 is a schematic view for illustrating misalignment between a first electrode and a second electrode in the comparative example.

As shown in FIGS. 12 and 13, in the printed wiring board in the comparative example, width Mw of each of first electrodes 11a of main substrate 1 is equal to width Sw of each of second electrodes 22a of rising substrate 2. In a case where the substrates have design values, the center of first electrode 11a overlaps with the center of second electrode 22a. However, in a case where dimensional tolerances are caused during manufacturing of the substrates, misalignment occurs in an overlapping width W between first electrode 11a and second electrode 22a, as shown in FIG. 14.

During flow soldering, the printed wiring board is immersed in molten solder from a front end of the printed wiring board and is soldered, while being transported by a conveyor. The molten solder jetted from the solder bath adheres to first electrode 11a and second electrode 22a, wettably spreads, and solidifies, thereby forming a solder joint. On this occasion, the amount of solder forming the solder joint is larger as overlapping width W between first electrode 11a and second electrode 22a is larger, and the amount of solder forming the solder joint is smaller as overlapping width W is smaller.

When the printed wiring board is assembled into a product after completion of soldering, and is exposed to a temperature cycle under a usage environment after operation, a strain is repeatedly generated in a solder joint to alleviate thermal stress caused by the difference in thermal expansion coefficient between rising substrate 2 and main substrate 1. Due to this strain, the solder joint eventually has fatigue failure. When the amount of solder forming the solder joint between rising substrate 2 and main substrate 1 is small, a life until the solder joint has fatigue failure becomes shorter than that when the amount of solder is large. Through the evaluation by the inventors, there has been obtained a result that, when the overlapping width between the electrode of rising substrate 2 and the electrode of main substrate 1 increases by 1.5 times, the effect of improving the life increases by about 6 times or more.

Therefore, in the printed wiring board in the comparative example, when a solder joint is formed with small overlapping width W due to occurrence of misalignment between first electrode 11a and second electrode 22a, the amount of solder is smaller than that in the case where the substrates have the design values. Thus, when the printed wiring board is exposed to the temperature cycle under the usage environment, the solder joint may have fatigue failure in a short time.

In contrast, according to printed wiring board 10 in the present embodiment, one width of width Mw of each of the plurality of first electrodes 11a and width Sw of each of the plurality of second electrodes 22a is larger than the other width, and the other width is arranged to fit within the one width of width Mw of each of the plurality of first electrodes 11a and width Sw of each of the plurality of second electrodes 22a. Thus, even when a maximum dimensional tolerance as shown in FIG. 8 is caused relative to the design values shown in FIG. 6 and misalignment occurs between first electrode 11a and second electrode 22a, first electrode 11a can reliably overlap with second electrode 22a by a smaller width of width Mw of first electrode 11a and width Sw of second electrode 22a. Thereby, a solder joint is reliably formed with the smaller width of the width of first electrode 11a and the width of second electrode 22a. Therefore, this can prevent the amount of solder of the solder joint from being decreased because the width of the solder joint is smaller than the smaller width of the width of first electrode 11a and the width of second electrode 22a. Thereby, a solder joint including a fillet with a fixed volume can be formed. Accordingly, a sufficient amount of solder can be secured, and thus a printed wiring board securing high reliability can be provided.

In addition, the accuracy of manufacturing tolerances during processing of the substrates is different for each substrate manufacturer. With the configuration in the present embodiment, any substrate manufacturer can fabricate printed wiring boards with suppressed variations in reliability, and thus can provide printed wiring boards having improved quality.

In addition, printed wiring board 10 in the present embodiment has the relation P/2>(Mw−Sw)/2≥D. Thereby, first electrode 11a can reliably overlap with second electrode 22a by width Sw of second electrode 22a.

Next, various variations of the present embodiment will be described with reference to FIGS. 15 to 22. It should be noted that, since the various variations of the present embodiment include the same components as those in the present embodiment described above unless otherwise specified, identical elements will be designated by the same reference numerals and the description thereof will not be repeated. Also in these various variations of the present embodiment, the same effect as that of the present embodiment described above can be obtained.

A first variation of the present embodiment will be described.

Although the present embodiment has described a case where one slit 11 is provided in main substrate 1 and one support portion 22 is provided in rising substrate 2, two or more slits 11 and two or more support portions 22 may be provided.

Figure 15:
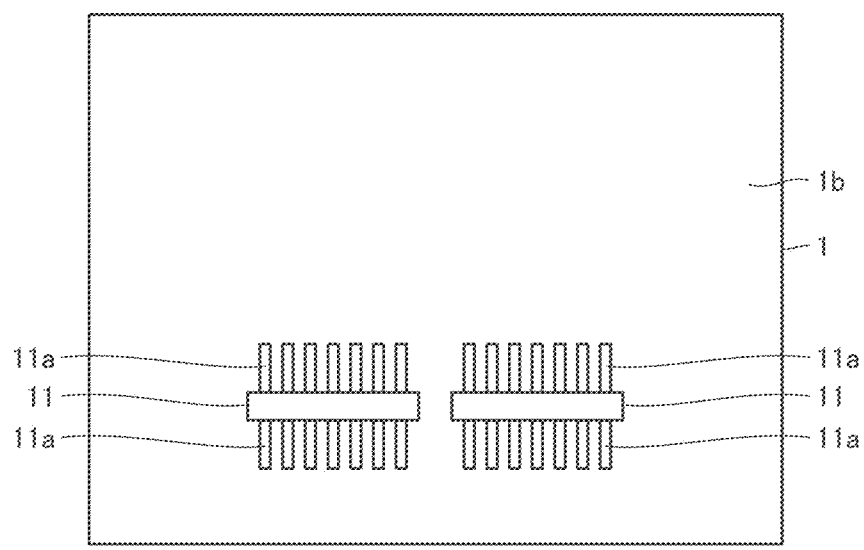
FIG. 15 is a bottom view schematically showing a configuration of a main substrate in a first variation of the first embodiment.
Figure 16:
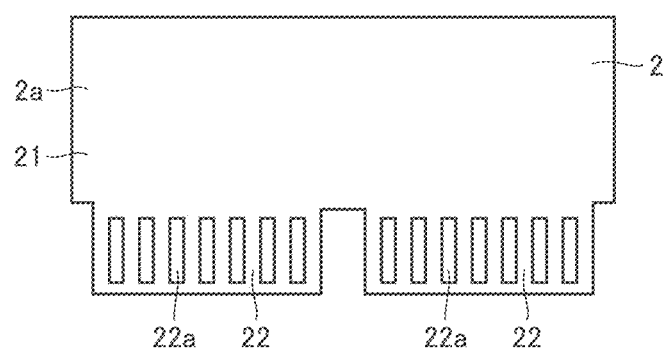
FIG. 16 is a front view schematically showing a configuration of a rising substrate in the first variation of the first embodiment.
Figure 17:
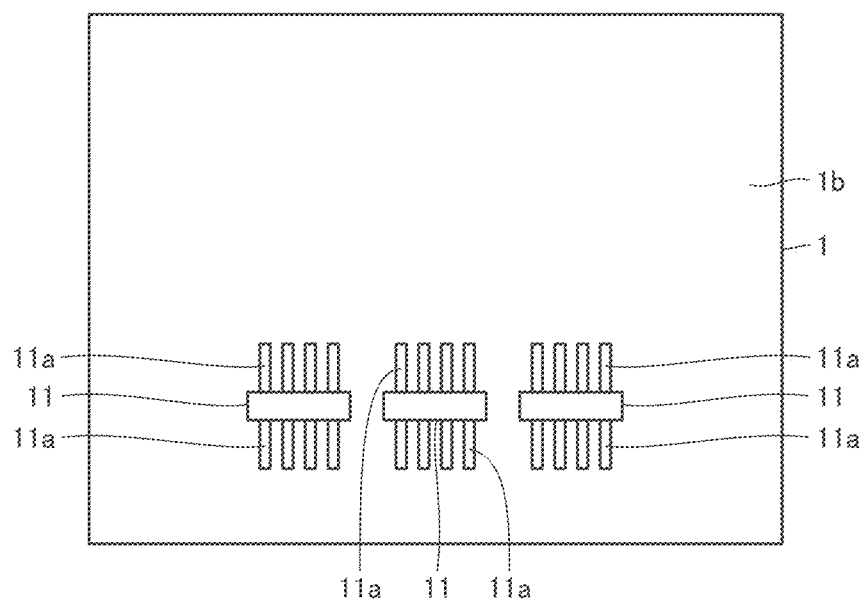
FIG. 17 is a bottom view schematically showing a configuration of another main substrate in the first variation of the first embodiment.
Figure 18:
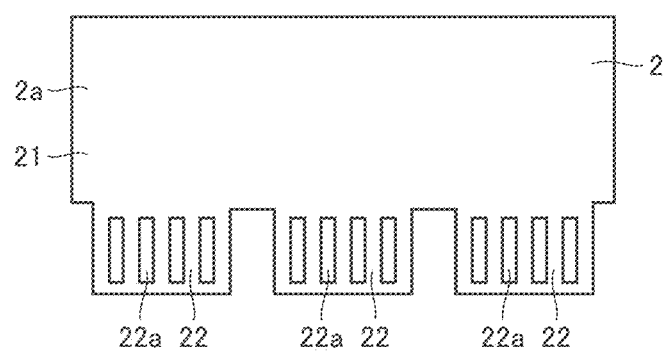
FIG. 18 is a front view schematically showing a configuration of another rising substrate in the first variation of the first embodiment.

As shown in FIGS. 15 and 16, in the first variation the present embodiment, for example, two slits 11 are provided in main substrate 1 and two support portions 22 are provided in rising substrate 2. Further, as shown in FIGS. 17 and 18, three slits 11 may be provided in main substrate 1 and three support portions 22 may be provided in rising substrate 2, According to the first variation of the first embodiment, by inserting a plurality of support portions 22 into a plurality of slits 11, rising substrate 2 is supported in main substrate 1 by the plurality of slits 11 and the plurality of support portions 22. Thereby, rising substrate 2 can be stably supported in main substrate 1.

Next, a second variation of the present embodiment will be described.

Figure 19:
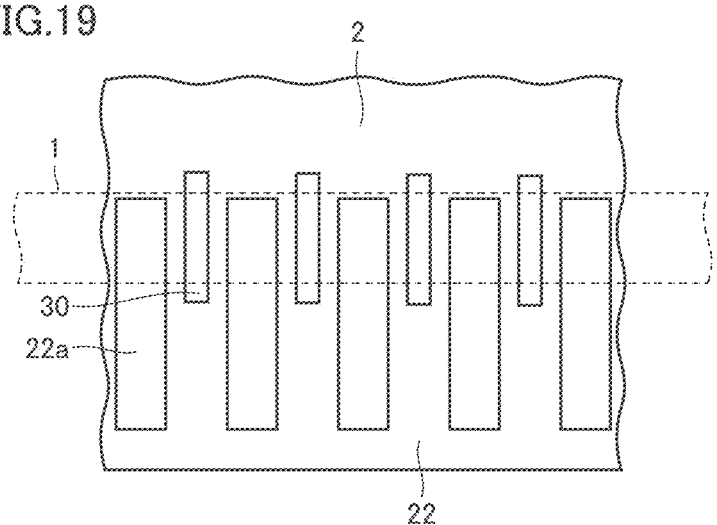
FIG. 19 is an enlarged front view schematically showing a configuration of a main substrate and a rising substrate in a second variation of the first embodiment.

As shown in FIG. 19, in the second variation of the present embodiment, at least one of a symbol ink and a solder resist is arranged between the plurality of second electrodes 22a. Specifically, bridge prevention lines 30 using at least one of a symbol ink and a solder resist are provided. It should be noted that main substrate 1 is indicated by a broken line in FIG. 19 for convenience of description.

The symbol ink is a symbol ink mainly composed of a common acrylic-based or epoxy-based resin. Specific examples of the symbol ink include USI-210W manufactured by Tamura Kaken, S-100W manufactured by Taiyo Ink, and the like. The symbol ink is formed by screen printing (a printing method in which holes are provided in a mesh screen itself and an ink is transferred therethrough), or an ink jet method.

When misalignment occurs between first electrode 11a and second electrode 22a, a solder bridge may occur due to a narrow gap between the electrodes. In particular, when a solder bridge occurs at an overlapping portion between rising substrate 2 and main substrate 1, it is impossible to repair the solder bridge without removing main substrate 1.

In the second variation of the present embodiment, since at least one of a symbol ink and a solder resist is arranged between the plurality of second electrodes 22a, occurrence of a solder bridge between the plurality of second electrodes 22a can be prevented.

Further, whether soldering is good or poor can be determined by matching the amount of protrusion of rising substrate 2 from main substrate 1 to allowable dimensions of floating and inclination of rising substrate 2, as shown in FIG. 19. Specifically, when bridge prevention lines 30 are exposed above and below main substrate 1, it can be determined that soldering is good. On the other hand, when soldering is performed with rising substrate 2 protruding from main substrate 1 by more than the allowable dimension of floating due to an insert error of rising substrate 2 or a solder jet, bridge prevention lines 30 are not exposed below main substrate 1, and thus it can be determined that soldering is poor. In addition, when soldering is performed with rising substrate 2 being inclined relative to main substrate 1 by more than the allowable dimension of inclination due to an insert error of rising substrate 2 or a solder jet, bridge prevention lines 30 are exposed in different amounts, and thus it can be determined that soldering is poor. Therefore, inspection can be facilitated.

Next, a third variation of the present embodiment will be described.

Figure 20:
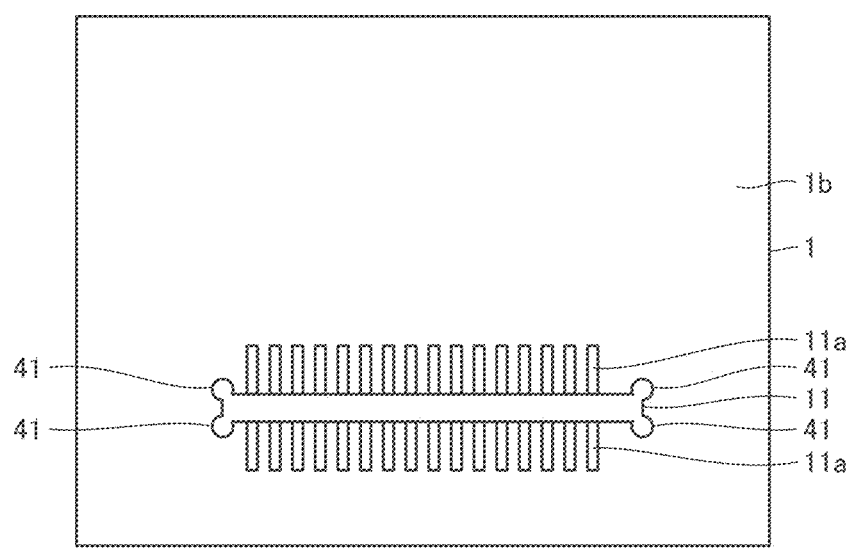
FIG. 20 is a bottom view schematically showing a configuration of a main substrate in a third variation of the first embodiment.

As shown in FIG. 20, in the third variation of the present embodiment, a first relief-processed portion 41 is provided at each of four corners of slit 11 along top surface 1a of main substrate 1. Each of four first relief-processed portions 41 has an arc shape spreading toward the outside of slit 11 along top surface 1a of main substrate 1.

Figure 21:
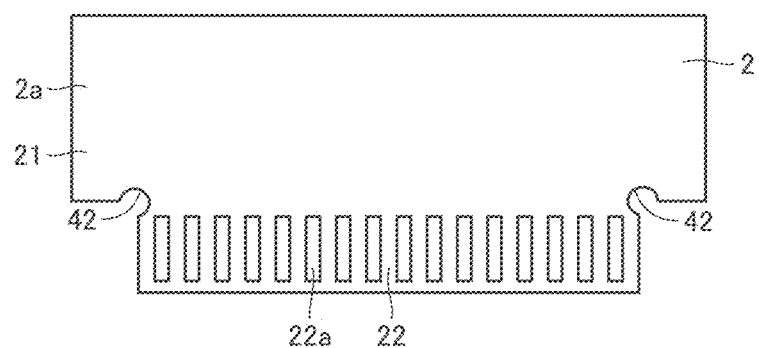
FIG. 21 is a front view schematically showing a configuration of a rising substrate in the third variation of the first embodiment.

In addition, as shown in FIG. 21, second relief-processed portions 42 are provided at a connection portion between support portion 22 and body portion 21 on one side and the other side of support portion 22 of rising substrate 2. That is, second relief-processed portions 42 are respectively provided on both sides of support portion 22 of rising substrate 2. Second relief-processed portion 42 on the one side of support portion 22 has an arc shape spreading toward the other side of support portion 22. Second relief-processed portion 42 on the other side of support portion 22 has an arc shape spreading toward the one side of support portion 22.

According to the third variation of the present embodiment, since first relief-processed portion 41 has an arc shape, angles at the four corners of slit 11 are removed. This can secure mutual contact between main substrate 1 and rising substrate 2. Further, since first relief-processed portion 41 has an arc shape, it has a small stress intensity factor. This can prevent occurrence of a crack in the portion provided with first relief-processed portion 41 due to vibration and the like.

In addition, since second relief-processed portion 42 has an arc shape, angles at the connection portion between support portion 22 and body portion 21 are removed. This can secure mutual contact between main substrate 1 and rising substrate 2. Further, since second relief-processed portion 42 has an arc shape, it has a small stress intensity factor. This can prevent occurrence of a crack in the portion provided with second relief-processed portion 42 due to vibration and the like.

Next, a fourth variation of the present embodiment will be described.

Although the present embodiment has described a case where width Mw of first electrode 11a is larger than width Sw of second electrode 22a, width Sw of second electrode 22a may be larger than width Mw of first electrode 11a.

Figure 22:
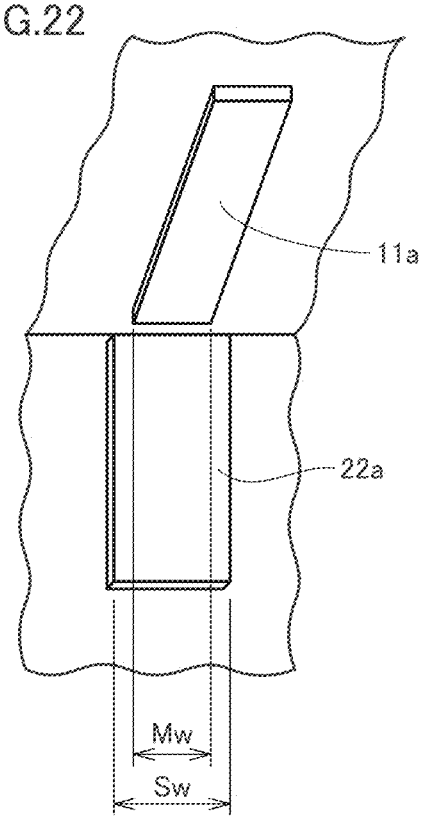
FIG. 22 is an enlarged perspective view showing the positional relation between a first electrode provided on a main substrate and a second electrode provided on a rising substrate in a fourth variation of the first embodiment.

As shown in FIG. 22, in the fourth variation of the present embodiment, width Sw of each of the plurality of second electrodes 22a is larger than width Mw of each of the plurality of first electrodes 11a. In addition, width Mw of each of the plurality of first electrodes 11a is arranged to fit within width Sw of each of the plurality of second electrodes 22a. That is, in the short direction of slit 11, each of the plurality of first electrodes 11a overlaps with each of the plurality of second electrodes 22a by the width of each of the plurality of first electrodes 11a.

Furthermore, the inventors have confirmed through experiments that, when first electrode 11a is larger than second electrode 22a, the amount of solder of a solder joint is larger than that when second electrode 22a is larger than first electrode 11a.

Next, other variations will be described.

Although CEM-3 is exemplified as a material for main substrate 1 and rising substrate 2 in the present embodiment described above, other materials may be used for main substrate 1 and rising substrate 2. For example, an FR-4 (Flame Retardant Type 4) base material formed by impregnating a glass fiber cloth with an epoxy resin, a paper phenol substrate formed by impregnating a paper insulator with a phenol resin, a ceramic substrate formed by simultaneously firing a wiring conductor and a ceramic base material, or the like may be used. In addition, substrates made of different materials may be combined, in such a manner that the material for rising substrate 2 is CEM-3 and the material for main substrate 1 is FR-4.

Further, although the present embodiment has described a case where slit 11 in main substrate 1 is provided by press working using a metal mold, slit 11 may be provided by cutting using a drill or a router.

Further, although the present embodiment has described a case where rising substrate 2 is mounted in main substrate 1 by the flow soldering method, rising substrate 2 may be mounted in main substrate 1 by a so-called a point flow method, which is a method of individually jetting molten solder to predetermined soldering points using nozzles, respectively.

Figure 44:
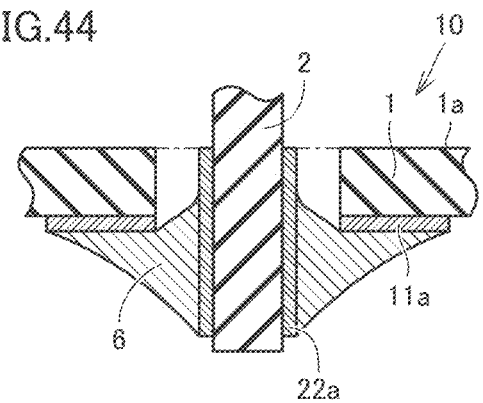
FIG. 44 is a front view schematically showing a configuration in a fifth variation of the first embodiment.
Figure 45:
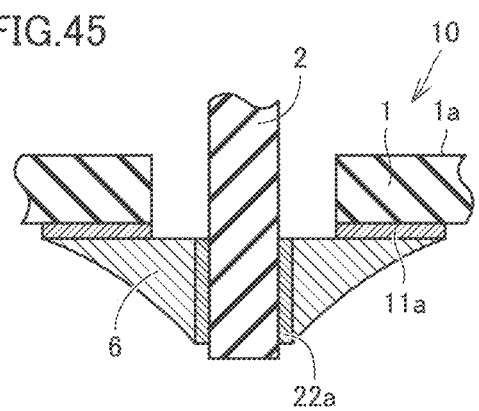
FIG. 45 is a view schematically showing a structure to be compared with the configuration in the fifth variation of the first embodiment.

Furthermore, in a fifth variation of the present embodiment, as shown in FIG. 44, when support portion 22 of rising substrate 2 is inserted into slit 11 in main substrate 1, the plurality of second electrodes 22a extend to a height of the top surface of main substrate 1. Since the length of second electrodes 22a (height position of upper ends of second electrodes 22a) reaches top surface 1a of main substrate 1 or extends thereabove, it is possible to increase the area wetted by solder, and achieve a structure which can hold as much solder as possible. In this case, it is possible to increase the volume forming a fillet, when compared with a case where the length of second electrodes 22a does not reach top surface 1a of main substrate 1 as shown in FIG. 45. Therefore, a sufficient amount of solder can be secured, and thus printed wiring board 10 securing high reliability can be provided.

Second Embodiment

A second embodiment of the present invention includes the same components as those in the first embodiment of the present invention described above, unless otherwise specified. Thus, identical elements will be designated by the same reference numerals, and the description thereof will not be repeated.

A configuration of printed wiring board 10 in the second embodiment of the present invention will be described with reference to FIGS. 23 to 25.

Figure 23:
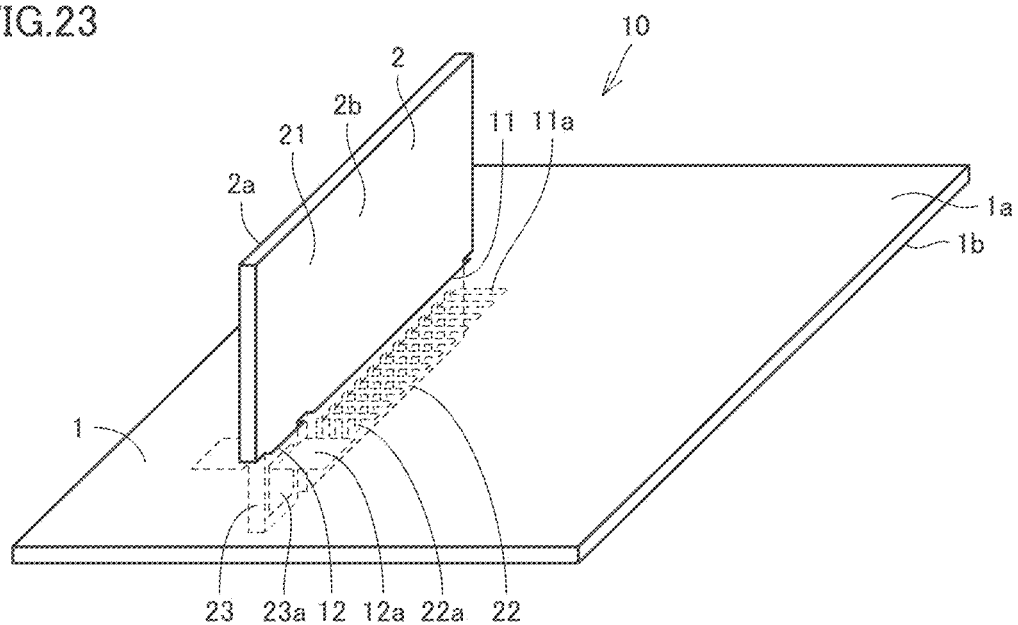
FIG. 23 is a perspective view schematically showing a configuration in which a rising substrate is mounted in a main substrate in a second embodiment of the present invention.
Figure 24:
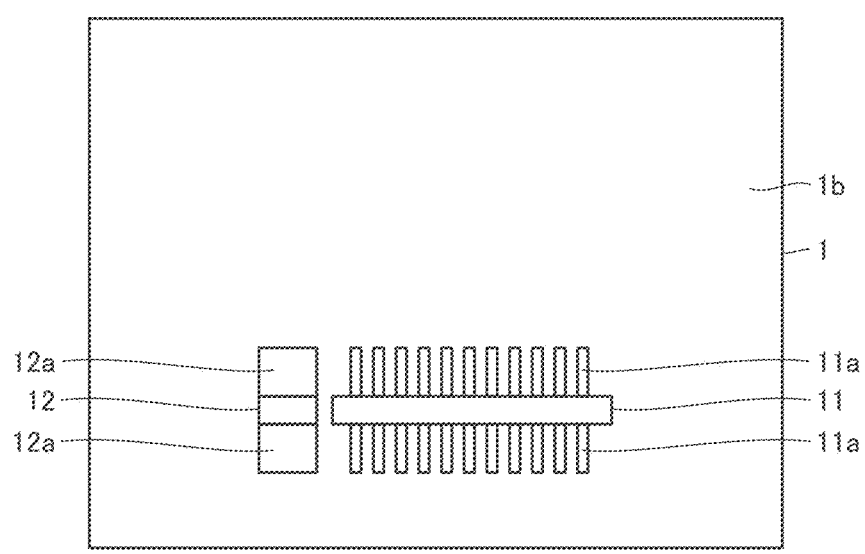
FIG. 24 is a bottom view schematically showing a configuration of the main substrate in the second embodiment of the present invention.

As shown in FIGS. 23 and 24, main substrate 1 has a first auxiliary slit 12 and two first auxiliary female electrodes 12a. First auxiliary slit 12 is provided to penetrate from top surface 1a to bottom surface 1b of main substrate 1. First auxiliary slit 12 is arranged on one side of slit 11. First auxiliary slit 12 is arranged to be linearly aligned with slit 11 in the longitudinal direction of slit 11. First auxiliary slit 12 is provided at a position corresponding to a first auxiliary support portion 23 described later.

Two first auxiliary female electrodes 12a are provided on bottom surface 1b of main substrate 1. Two first auxiliary female electrodes 12a are arranged with first auxiliary slit 12 being sandwiched therebetween in a short direction of first auxiliary slit 12.

Figure 25:
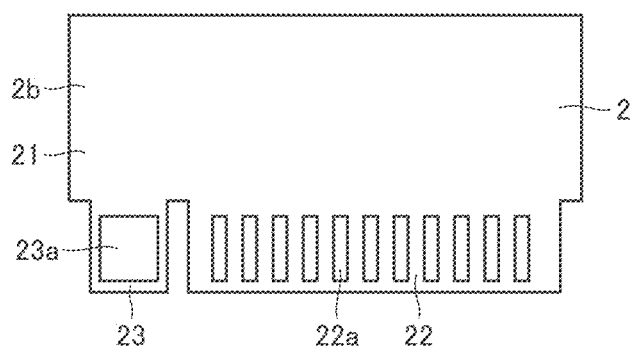
FIG. 25 is a front view schematically showing a configuration of the rising substrate in the second embodiment of the present invention.

As shown in FIGS. 23 and 25, rising substrate 2 has first auxiliary support portion 23 and two first auxiliary male electrodes 23a. First auxiliary support portion 23 is provided to protrude downward from body portion 21 at the lower portion of rising substrate 2. Two first auxiliary male electrodes 23a are provided in first auxiliary support portion 23.

Two first auxiliary male electrodes 23a are provided on both of front surface 2a and rear surface 2b of rising substrate 2.

The surface area of first auxiliary female electrode 12a is larger than the surface area of each of the plurality of first electrodes 11a. The surface area of first auxiliary male electrode 23a is larger than the surface area of each of the plurality of second electrodes 22a.

First auxiliary support portion 23 is inserted into first auxiliary slit 12. In this state, two first auxiliary male electrodes 23a are soldered to two first auxiliary female electrodes 12a, respectively. Support portion 22 is arranged to be spaced from an entire inner peripheral surface of slit 11. Dimensions of support portion 22 and slit 11 in the longitudinal direction of slit 11 are respectively larger than dimensions of first auxiliary support portion 23 and first auxiliary slit 12 in the longitudinal direction of slit 11.

The width of first electrode 11a of main substrate 1, the width of second electrode 22a of rising substrate 2, and the like will be described in further detail with reference to FIGS. 26 to 31.

Figure 26:
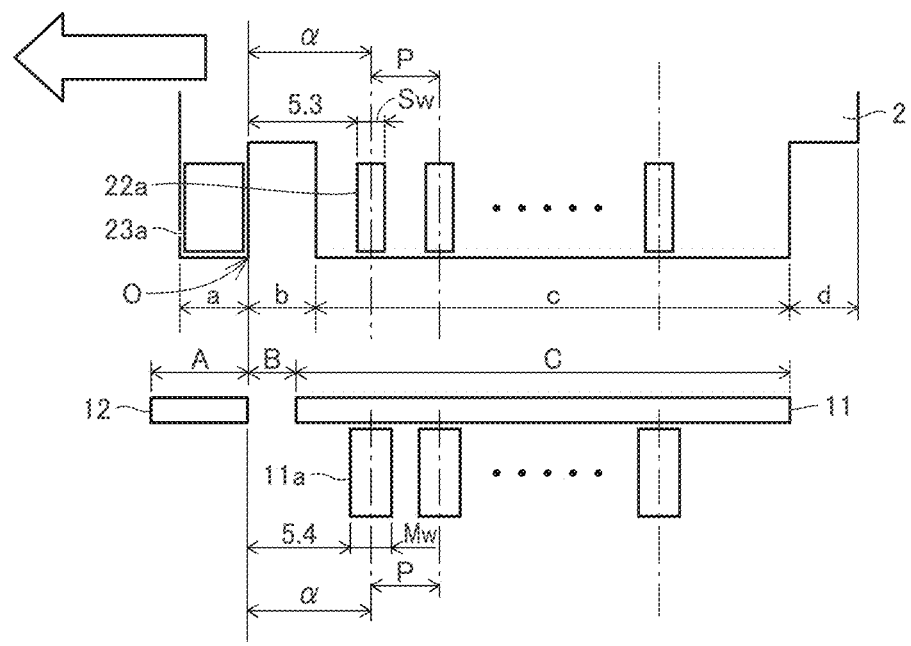
FIG. 26 is a schematic view for illustrating a configuration of the main substrate and the rising substrate having design values in the second embodiment of the present invention.
Figure 27:
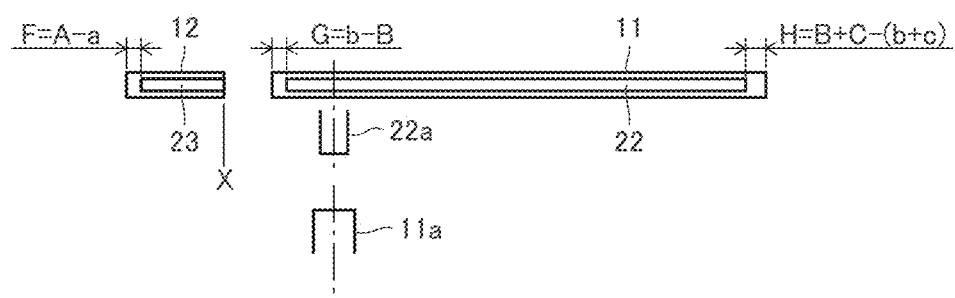
FIG. 27 is a schematic view for illustrating a configuration of a slit and a support portion having design values in the second embodiment of the present invention.

As shown in FIGS. 26 and 27, the width and the position of each of first electrode 11a and second electrode 22a are designed such that, based on a certain determined origin O, the center of first electrode 11a matches the center of second electrode 22a. Origin O is, for example, a position where first auxiliary support portion 23 overlaps with first auxiliary slit 12 on a rear side in a flow direction.

In any of a combination in which rising substrate 2 has a maximum dimension and main substrate 1 has a minimum dimension and a combination in which rising substrate 2 has a minimum dimension and main substrate 1 has a maximum dimension, which are caused by dimensional tolerances, support portion 22 does not contact slit 11 even if rising substrate 2 is misaligned within slit 11 during mounting.

In any of the combination in which rising substrate 2 has the maximum dimension and main substrate 1 has the minimum dimension and the combination in which rising substrate 2 has the minimum dimension and main substrate 1 has the maximum dimension, the electrode of main substrate 1 reliably overlaps with the electrode of rising substrate 2 by any of the width of the electrode of main substrate 1 and the width of the electrode of rising substrate 2, even if rising substrate 2 is misaligned within slit 11 during mounting.

Here, details of each design value thereof will be described.

First, a case where the substrates have design values (nominal values) will be described with reference to FIGS. 26 and 27.

As shown in FIG. 26, width Mw of first electrode 11a and width Sw of second electrode 22a have a relation Mw>Sw. Portions of rising substrate 2 have dimensions a, b, c, and d, where a is a width of first auxiliary support portion 23, b is a spacing between first auxiliary support portion 23 and support portion 22, c is a width of support portion 22, and d is a width of body portion 21 protruding from support portion 22 on the other end side of rising substrate 2. Portions of main substrate 1 have dimensions A, B, and C, where A is a width of first auxiliary slit 12, B is a spacing between first auxiliary slit 12 and slit 11, and C is a width of slit 11.

First electrode 11a and second electrode 22a are designed such that, when rising substrate 2 is caused to flow by jet solder during flow soldering and first auxiliary support portion 23 contacts first auxiliary slit 12 at an X portion, the center of first electrode 11a of main substrate 1 matches the center of second electrode 22a of rising substrate 2, at a position having distance $\alpha$ from the origin. First electrodes 11a and second electrodes 22a are designed to be aligned at pitch P. On this occasion, as shown in FIG. 27, a gap between first auxiliary slit 12 and first auxiliary support portion 23 is indicated by F. Gaps between slit 11 and support portion 22 on one side and the other side are indicated by G and H.

Figure 28:
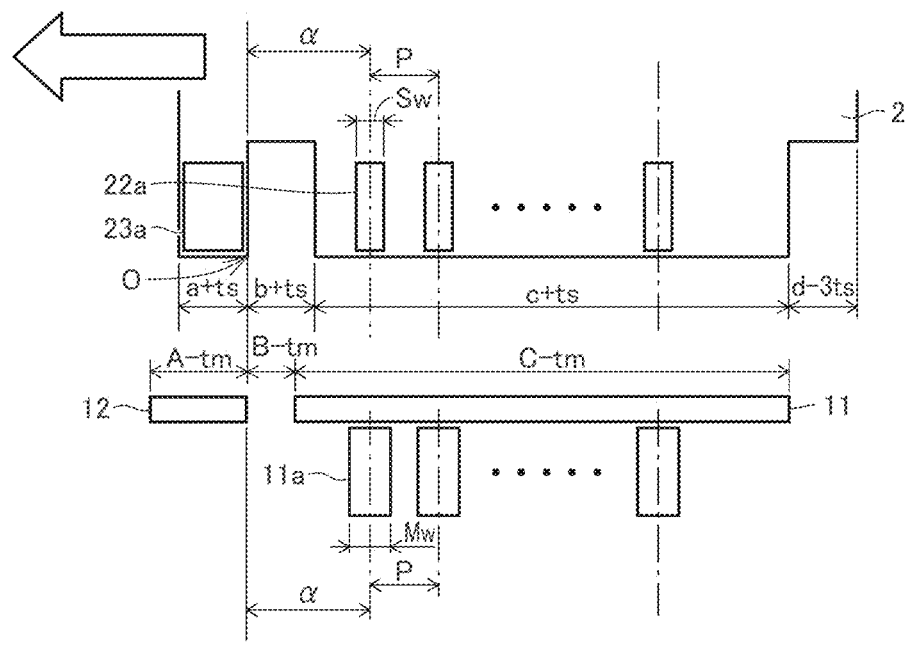
FIG. 28 is a schematic view for illustrating a configuration in which the rising substrate has a maximum dimension and the main substrate has a minimum dimension in the second embodiment of the present invention.

Next, a case where rising substrate 2 has the maximum dimension and main substrate 1 has the minimum dimension will be described with reference to FIGS. 28 and 29.

Values of plus/minus tolerances in processing rising substrate 2 and slit 11 are indicated by ts and tm, respectively. On this occasion, each portion has a dimension as shown in FIG. 28.

Here, the tolerance in forming the electrodes during manufacturing of the substrates is neglected, and it is assumed that the values of $\alpha$, Sw, Mw, and P remain unchanged. Thus, when rising substrate 2 is caused to flow by a jet during flow soldering and contacts first auxiliary slit 12 at X portion, the center of second electrode 22a of rising substrate 2 matches the center of first electrode 11a of main substrate 1, at a position having distance $\alpha$ from origin O.

Figure 29:
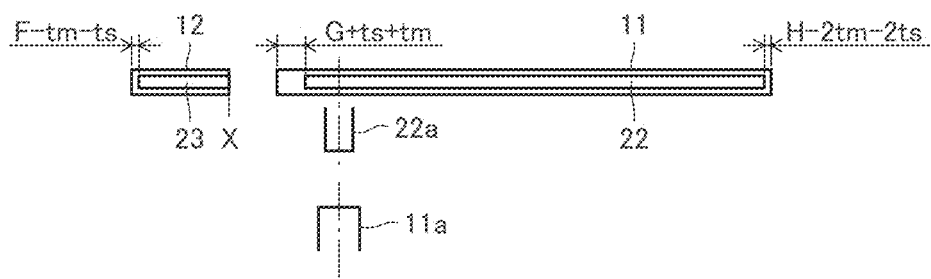
FIG. 29 is a schematic view for illustrating a configuration of the slit and the support portion in the configuration in which the rising substrate has the maximum dimension and the main substrate has the minimum dimension in the second embodiment of the present invention.

On this occasion, the gaps are indicated by F, G, and H shown in FIG. 29.

When the value of G+ts+tm is more than the value of F−tm−ts, end portions of support portion 22 have no contact within slit 11 even if rising substrate 2 is misaligned within slit 11.

Further, when the value of (Mw−Sw)/2 is more than or equal to the value of F−tm−ts, first electrode 11a can reliably overlap with second electrode 22a by the width of Sw even if rising substrate 2 is misaligned within slit 11.

When the above relation is expressed by an expression, an expression (2) is obtained:

$$G+ts+tm > (Mw-Sw)/2 \geq F-tm-ts \qquad (2).$$

Next, a case where rising substrate 2 has the minimum dimension and main substrate 1 has the maximum dimension will be described with reference to FIGS. 30 and 31.

Figure 30:
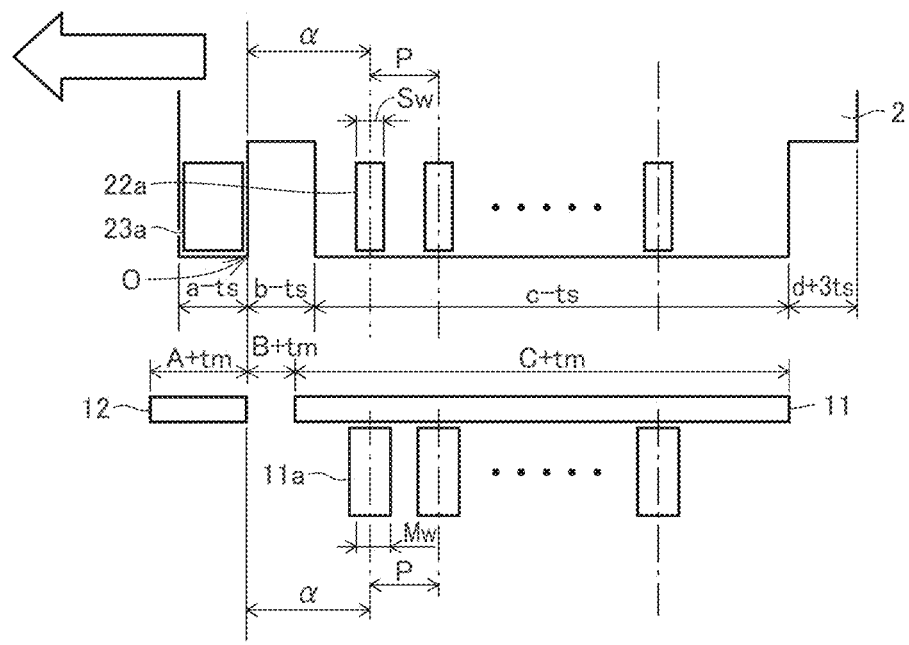
FIG. 30 is a schematic view for illustrating a configuration in which the rising substrate has a minimum dimension and the main substrate has a maximum dimension in the second embodiment of the present invention.

On this occasion, each portion has a dimension as shown in FIG. 30.

Here, the tolerance in forming the electrodes during manufacturing of the substrates is neglected, and it is assumed that the values of $\alpha$, Sw, Mw, and P remain unchanged. Thus, when rising substrate 2 is caused to flow by a jet during flow soldering and contacts first auxiliary slit 12 at X portion, the center of second electrode 22a of rising substrate 2 matches the center of first electrode 11a of main substrate 1, at a position having distance $\alpha$ from origin O.

Figure 31:
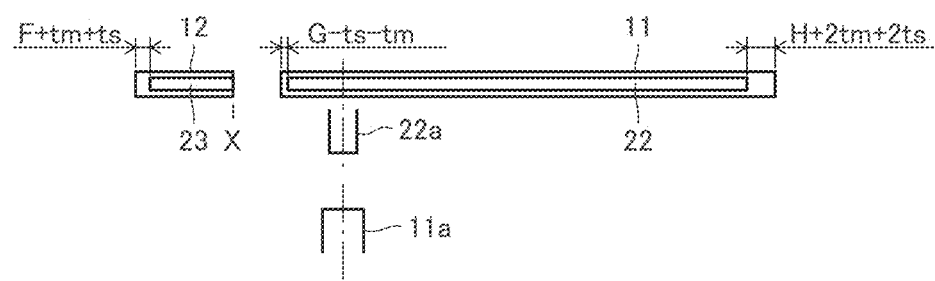
FIG. 31 is a schematic view for illustrating a configuration of the slit and the support portion in the configuration in which the rising substrate has the minimum dimension and the main substrate has the maximum dimension in the second embodiment of the present invention.

On this occasion, the gaps are indicated by F, G, and H shown in FIG. 31.

When the value of G−ts−tm is more than the value of F+tm+ts, end portions of support portion 22 have no contact within slit 11 even if rising substrate 2 is misaligned within slit 11.

Further, when the value of (Mw−Sw)/2 is more than or equal to the value of F+tm+ts, first electrode 11a can reliably overlap with second electrode 22a by the width of Sw even if rising substrate 2 is misaligned within slit 11.

When the above relation is expressed by an expression, an expression (3) is obtained:

$$G-ts-tm > (Mw-Sw)/2 \geq F+tm+ts \qquad (3).$$

In order to satisfy both expressions (2) and (3), it is only necessary to satisfy expression (3).

Here, it is generally satisfactory to assume that the tolerance in forming the electrodes during manufacturing of the substrates, which is neglected above, is more than or equal to 0.05 mm.

Thus, when the above relation is expressed by an expression, the present embodiment satisfies an expression (4):

$$G-ts-tm>(Mw-Sw)/2 \geq F+tm+ts \geq 0.05 \qquad (4).$$

Next, a method for manufacturing the printed wiring board in the present embodiment will be described with reference to FIG. 23.

As shown in FIG. 23, support portion 22 and first auxiliary support portion 23 are vertically inserted into slit 11 and first auxiliary slit 12, respectively. In this state, first electrodes 11a are soldered to second electrodes 22a, and first auxiliary female electrodes 12a are soldered to first auxiliary male electrodes 23a.

For example, the electrodes of main substrate 1 and rising substrate 2 transported by a conveyor with rising substrate 2 being attached to main substrate 1 are soldered with each other by a flow soldering method in which the electrodes are immersed in a molten solder jet and are soldered. Thereby, first electrodes 11a are soldered and fixed to second electrodes 22a, and first auxiliary female electrodes 12a are soldered and fixed to first auxiliary male electrodes 23a.

Next, the function and effect of the present embodiment will be described.

Also in the present embodiment, the same effect as that of the first embodiment described above can be obtained.

In addition, in printed wiring board 10 in the present embodiment, support portion 22 is arranged to be spaced from the entire inner peripheral surface of slit 11. As shown in FIG. 27, in the state after mounting, both ends of support portion 22 on one side and the other side do not contact slit 11. Thus, a strain generated in second electrodes 22a in support portion 22 is equalized. Thereby, a life until a solder joint ruptures is prolonged, when compared with a case where one end of support portion 22 contacts slit 11. It should be noted that the inventors have confirmed through experiments that, when the ends of support portion 22 do not contact slit 11, the life is prolonged about twice when compared with the case where one end of support portion 22 contacts slit 11. Therefore, a printed wiring board having high reliability until a solder joint ruptures can be provided.

In addition, in printed wiring board 10 in the present embodiment, the dimensions of support portion 22 and slit 11 in the longitudinal direction of slit 11 are respectively larger than the dimensions of first auxiliary support portion 23 and first auxiliary slit 12 in the longitudinal direction of slit 11. This can prevent incorrect assembly in which support portion 22 and first auxiliary support portion 23 are reversely inserted into first auxiliary slit 12 and slit 11 when rising substrate 2 is inserted into main substrate 1. Therefore, printed wiring board 10 excellent in assembling property can be provided.

In addition, in printed wiring board 10 in the present embodiment, the surface area of first auxiliary female electrode 12a is larger than the surface area of each of the plurality of first electrodes 11a, and the surface area of first auxiliary male electrode 23a is larger than the surface area of each of the plurality of second electrodes 22a. Thus, bonding strength can be enhanced by increasing the amount of solder of a solder joint.

Next, various variations of the present embodiment will be described. Although the present embodiment has described a case where first auxiliary support portion 23 and first auxiliary slit 12 are arranged on a front side in the flow direction, first auxiliary support portion 23 and first auxiliary slit 12 may be arranged on a rear side in the flow direction.

Third Embodiment

A third embodiment of the present invention includes the same components as those in the first and second embodiments of the present invention described above, unless otherwise specified. Thus, identical elements will be designated by the same reference numerals, and the description thereof will not be repeated.

A configuration of printed wiring board 10 in the third embodiment of the present invention will be described with reference to FIGS. 32 to 34.

Figure 32:
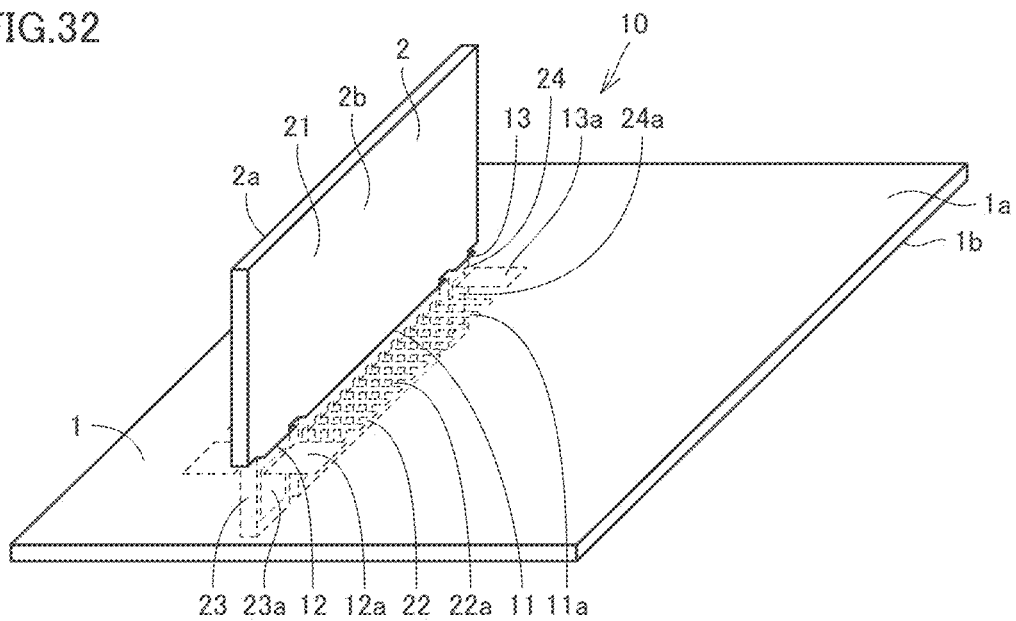
FIG. 32 is a perspective view schematically showing a configuration in which a rising substrate is mounted in a main substrate in a third embodiment of the present invention.
Figure 33:
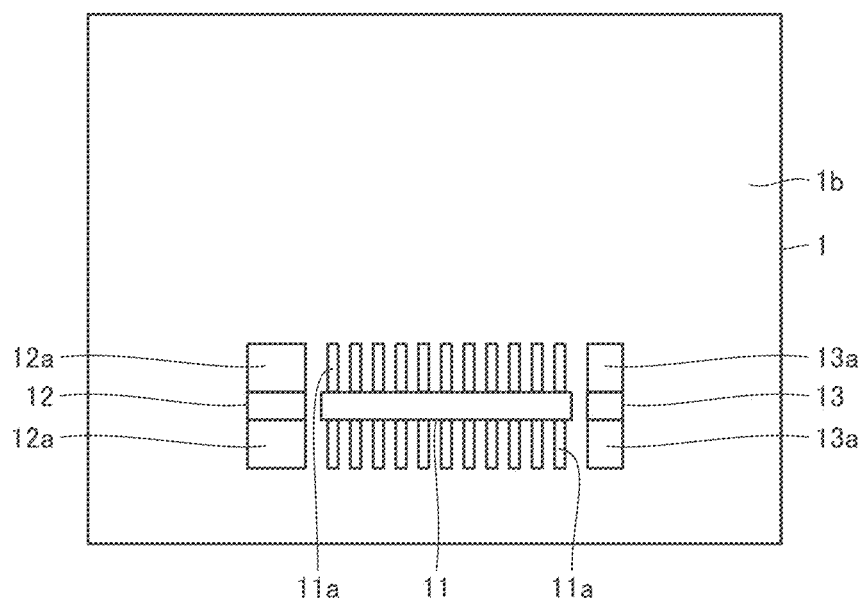
FIG. 33 is a bottom view schematically showing a configuration of the main substrate in the third embodiment of the present invention.

As shown in FIGS. 32 and 33, main substrate 1 has a second auxiliary slit 13 and two second auxiliary female electrodes 13a. Second auxiliary slit 13 is provided to penetrate from top surface 1a to bottom surface 1b of main substrate 1. Second auxiliary slit 13 is arranged to be linearly aligned with slit 11 and first auxiliary slit 12 in the longitudinal direction of slit 11. First auxiliary slit 12 and second auxiliary slit 13 are arranged on both sides of slit 11. Second auxiliary slit 13 is provided at a position corresponding to a second auxiliary support portion 24 described later.

Two second auxiliary female electrodes 13a are provided on bottom surface 1b of main substrate 1. Two second auxiliary female electrodes 13a are arranged with second auxiliary slit 13 being sandwiched therebetween in a short direction of second auxiliary slit 13.

Figure 34:
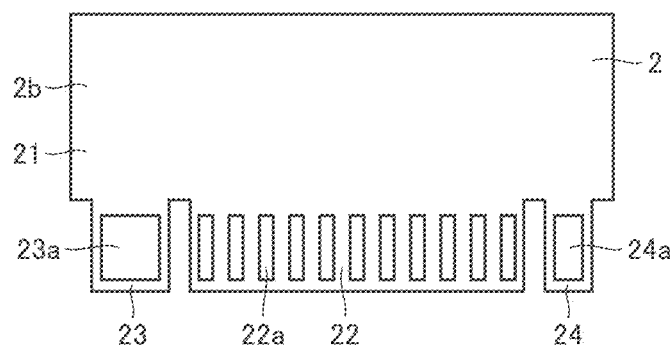
FIG. 34 is a front view schematically showing a configuration of the rising substrate in the third embodiment of the present invention.

As shown in FIGS. 32 and 34, rising substrate 2 has second auxiliary support portion 24 and two second auxiliary male electrodes 24a. Second auxiliary support portion 24 is provided to protrude downward from body portion 21 at the lower portion of rising substrate 2. First auxiliary support portion 23 and second auxiliary support portion 24 are arranged on both sides of support portion 22. Two second auxiliary male electrodes 24a are provided in second auxiliary support portion 24. Two second auxiliary male electrodes 24a are provided on both of front surface 2a and rear surface 2b of rising substrate 2.

The surface area of first auxiliary female electrode 12a is larger than the surface area of each of the plurality of first electrodes 11a. The surface area of first auxiliary male electrode 23a is larger than the surface area of each of the plurality of second electrodes 22a. The surface area of second auxiliary female electrode 13a is larger than the surface area of each of the plurality of first electrodes 11a. The surface area of second auxiliary male electrode 24a is larger than the surface area of each of the plurality of second electrodes 22a.

Second auxiliary support portion 24 is inserted into second auxiliary slit 13. In this state, two second auxiliary male electrodes 24a are soldered to two second auxiliary female electrodes 13a, respectively. Support portion 22 is arranged to be spaced from an entire inner peripheral surface of slit 11. Dimensions of first auxiliary support portion 23 and first auxiliary slit 12 in the longitudinal direction of slit 11 are respectively larger than dimensions of second auxiliary support portion 24 and second auxiliary slit 13 in the longitudinal direction of slit 11.

The width of first electrode 11a of main substrate 1, the width of second electrode 22a of rising substrate 2, and the like will be described in further detail with reference to FIGS. 35 to 42.

Figure 35:
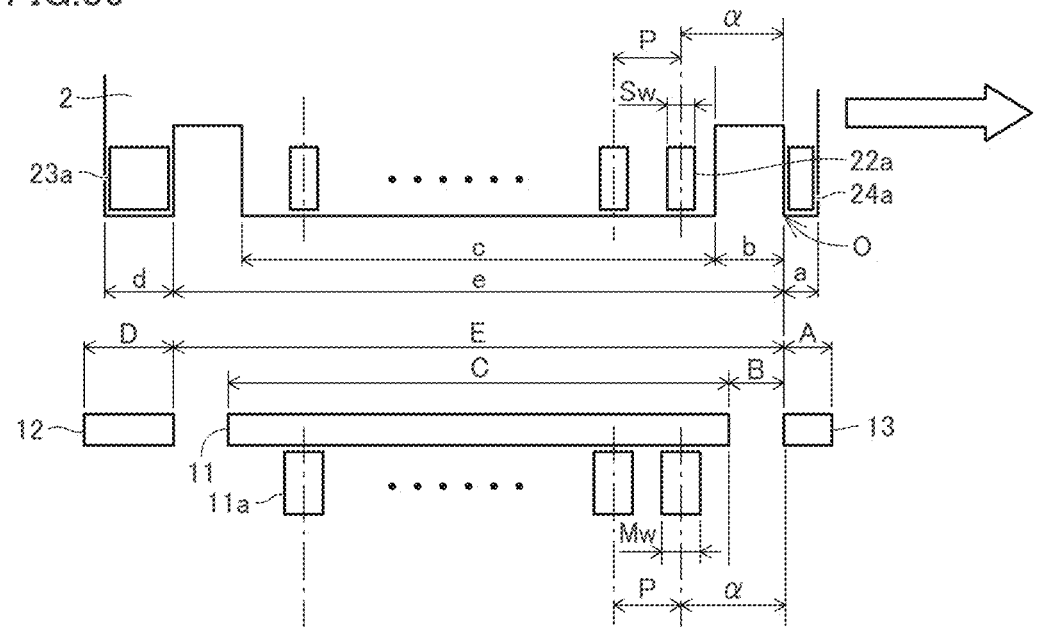
FIG. 35 is a schematic view for illustrating a configuration of the main substrate and the rising substrate having design values in the third embodiment of the present invention.
Figure 36:
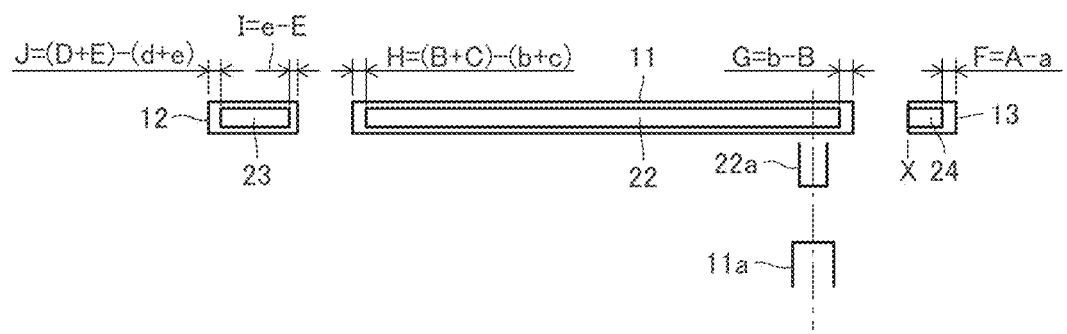
FIG. 36 is a schematic view for illustrating a configuration of a slit and a support portion having design values in the third embodiment of the present invention.

As shown in FIGS. 35 and 36, the width and the position of each of first electrode 11a and second electrode 22a are designed such that, based on a certain determined origin O, the center of first electrode 11a matches the center of second electrode 22a. Origin O is, for example, a position where second auxiliary support portion 24 overlaps with second auxiliary slit 13 on a rear side in a flow direction.

In any of a combination in which rising substrate 2 has a maximum dimension and main substrate 1 has a minimum dimension and a combination in which rising substrate 2 has a minimum dimension and main substrate 1 has a maximum dimension, which are caused by dimensional tolerances, support portion 22 does not contact slit 11, and the electrode of main substrate 1 reliably overlaps with the electrode of rising substrate 2 by any of the width of the electrode of main substrate 1 and the width of the electrode of rising substrate 2, even if rising substrate 2 is misaligned within slit 11 during mounting.

Here, details of each design value thereof will be described.

First, a case where the substrates have design values (nominal values) will be described with reference to FIGS. 35 and 36.

As shown in FIG. 35, width Mw of first electrode 11a and width Sw of second electrode 22a have a relation Mw>Sw. Portions of rising substrate 2 have dimensions a, b, c, d, and e, where a is a width of second auxiliary support portion 24, b is a spacing between second auxiliary support portion 24 and support portion 22, c is a width of support portion 22, d is a width of first auxiliary support portion 23, and e is a spacing between first auxiliary support portion 23 and second auxiliary support portion 24.

Portions of main substrate 1 have dimensions A, B, C, D, and E, where A is a width of second auxiliary slit 13, B is a spacing between second auxiliary slit 13 and slit 11, C is a width of slit 11, D is a width of first auxiliary slit 12, and E is a spacing between first auxiliary slit 12 and second auxiliary slit 13.

First electrode 11a and second electrode 22a are designed such that, when rising substrate 2 is caused to flow by a jet during flow soldering and second auxiliary support portion 24 contacts second auxiliary slit 13 at an X portion, the center of first electrode 11a of main substrate 1 matches the center of second electrode 22a of rising substrate 2, at a position having distance α from the origin. First electrodes 11a and second electrodes 22a are designed to be aligned at pitch P. On this occasion, as shown in FIG. 36, a gap between second auxiliary slit 13 and second auxiliary support portion 24 is indicated by F. Gaps between slit 11 and support portion 22 on one side and the other side are indicated by G and H. A gap between first auxiliary slit 12 and first auxiliary support portion 23 is indicated by I and J.

Figure 37:
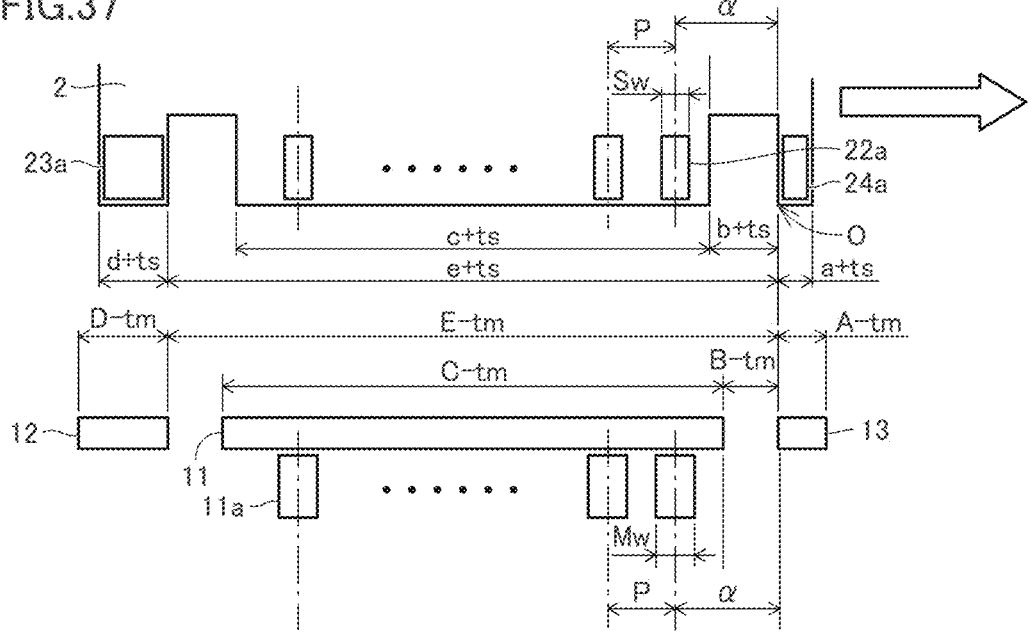
FIG. 37 is a schematic view for illustrating a configuration in which the rising substrate has a maximum dimension and the main substrate has a minimum dimension in the third embodiment of the present invention.

Next, a case where rising substrate 2 has the maximum dimension and main substrate 1 has the minimum dimension will be described with reference to FIGS. 37 to 39. Values of plus/minus tolerances in processing rising substrate 2 and slit 11 are indicated by ts and tm, respectively. On this occasion, each portion has a dimension as shown in FIG. 37.

Here, the tolerance in forming the electrodes during manufacturing of the substrates is neglected, and it is assumed that the values of α, Sw, Mw, and P remain unchanged. Thus, when rising substrate 2 is caused to flow by a jet during flow soldering and contacts second auxiliary slit at X portion, the center of second electrode 22a of rising substrate 2 matches the center of first electrode 11a of main substrate 1, at a position having distance α from origin O.

Figure 38:
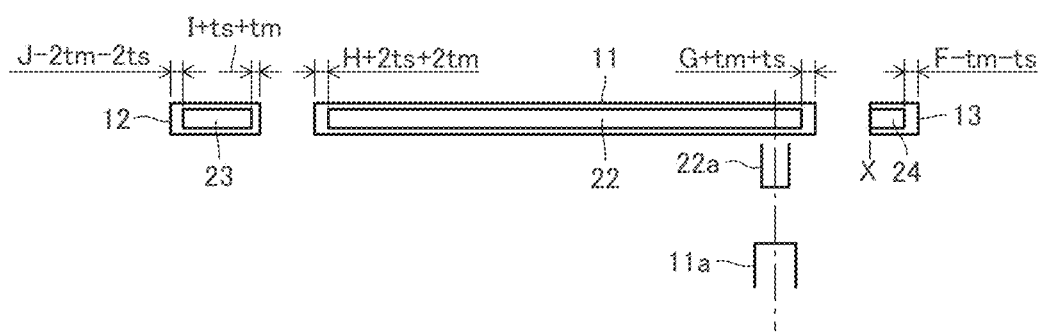
FIG. 38 is a schematic view for illustrating a configuration of the slit and the support portion in the configuration in which the rising substrate has the maximum dimension and the main substrate has the minimum dimension in the third embodiment of the present invention.

On this occasion, the gaps are indicated by F, G, H, I, and J shown in FIG. 38.

Figure 39:
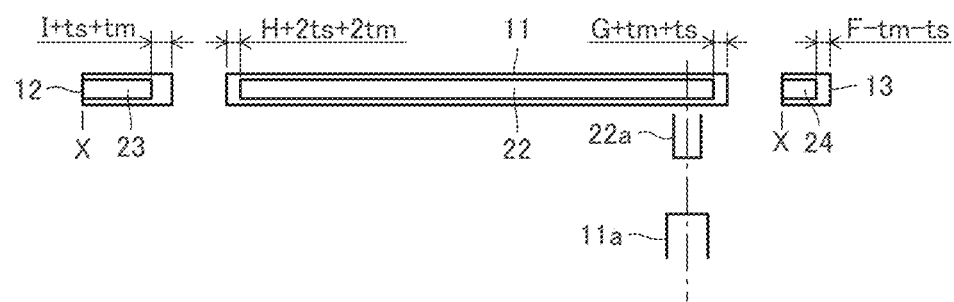
FIG. 39 is a schematic view for illustrating another configuration of the slit and the support portion in the configuration in which the rising substrate has the maximum dimension and the main substrate has the minimum dimension in the third embodiment of the present invention.

When the value of J−2tm−2ts is 0, the value of H+2ts+2tm is more than 0, and the value of G+tm+ts is more than 0 as shown in FIG. 39, second auxiliary support portion 24 contacts second auxiliary slit 13 at X portion on one side, and first auxiliary support portion 23 contacts first auxiliary slit 12 at an X portion on the other side. Further, on this occasion, end portions of support portion 22 do not contact slit 11.

When the above relation is expressed by expressions, expressions (5), (6), and (7) are obtained:

$$J-2tm-2ts=0 \quad (5);$$

$$H+2ts+2tm>0 \quad (6);$$

$$G+tm+ts>0 \quad (7).$$

Figure 40:
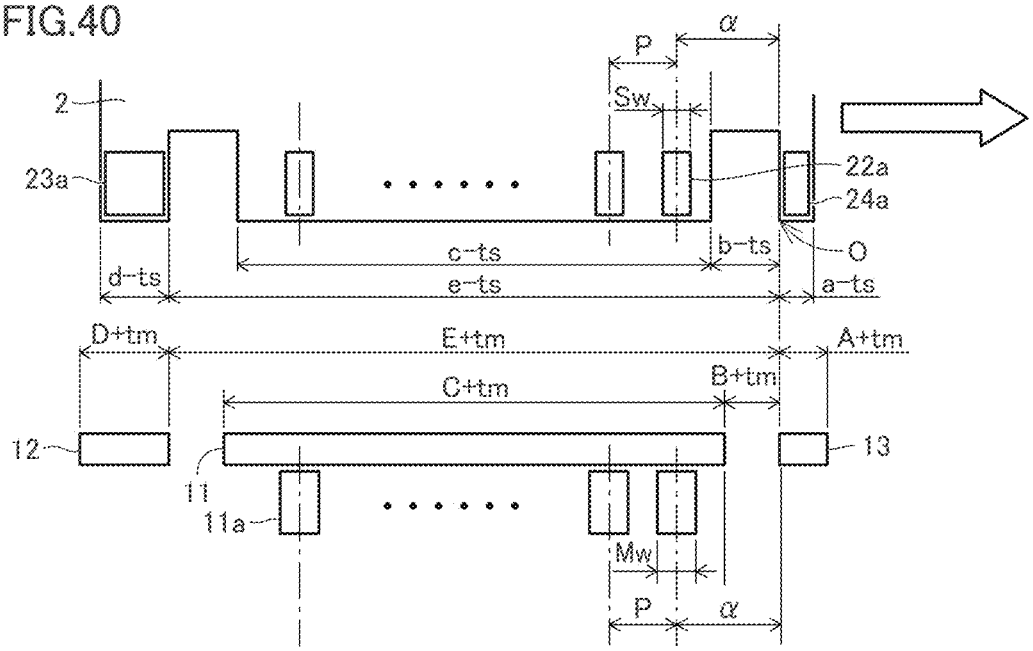
FIG. 40 is a schematic view for illustrating a configuration in which the rising substrate has a minimum dimension and the main substrate has a maximum dimension in the third embodiment of the present invention.

Next, a case where rising substrate 2 has the minimum dimension and main substrate 1 has the maximum dimension will be described with reference to FIGS. 40 to 42. On this occasion, each portion has a dimension as shown in FIG. 40.

Figure 41:
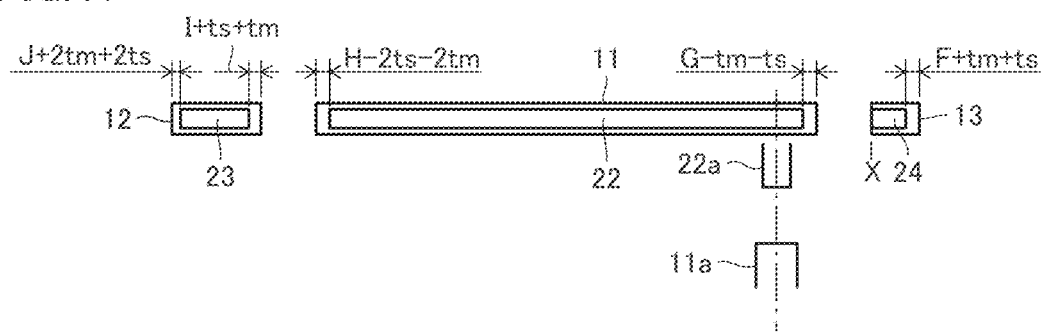
FIG. 41 is a schematic view for illustrating a configuration of the slit and the support portion in the configuration in which the rising substrate has the minimum dimension and the main substrate has the maximum dimension in the third embodiment of the present invention.

On this occasion, the gaps are indicated by F, G, H, I, and J shown in FIG. 41.

Figure 42:
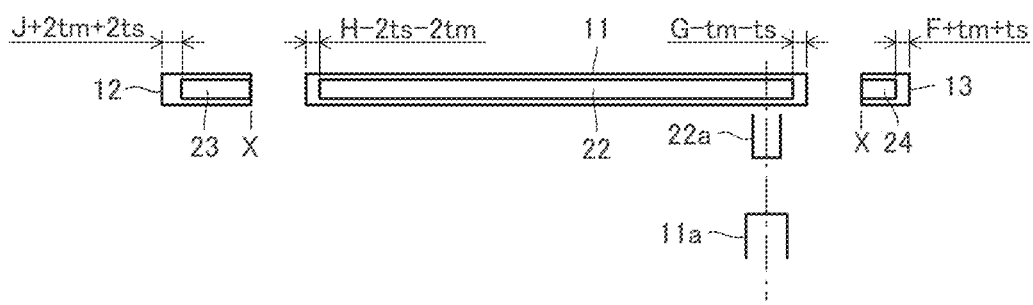
FIG. 42 is a schematic view for illustrating another configuration of the slit and the support portion in the configuration in which the rising substrate has the minimum dimension and the main substrate has the maximum dimension in the third embodiment of the present invention.

When the value of I+ts+tm is 0, the value of H−2ts−2tm is more than 0, and the value of G−tm−ts is more than 0 as shown in FIGS. 41 and 42, second auxiliary support portion 24 contacts second auxiliary slit 13 at X portion on one side, and first auxiliary support portion 23 contacts first auxiliary slit 12 at an X portion on the other side. Further, on this occasion, end portions of support portion 22 do not contact slit 11.

When the above relation is expressed by expressions, expressions (8), (9), and (10) are obtained:

$$I+tm+ts=0 \quad (8);$$

$$H-2ts-2tm>0 \quad (9);$$

$$G-tm-ts>0 \quad (10).$$

Here, it is generally satisfactory to assume that the tolerance in forming the electrodes during manufacturing of the substrates, which is neglected above, is more than or equal to 0.05 mm.

Thus, as long as the value of (Mw−Sw)/2 is more than or equal to 0.05 mm, first electrode 11a can reliably overlap with second electrode 22a by the width of Sw.

When the above relation is expressed by an expression, an expression (11) is obtained:

$$(Mw-Sw)/2 \geq 0.05 \quad (11).$$

Thus, in order to satisfy all expressions (5) to (11), it is only necessary to satisfy expressions (5), (8), (9), (10), and (11).

Next, a method for manufacturing the printed wiring board in the present embodiment will be described with reference to FIG. 32.

As shown in FIG. 32, support portion 22, first auxiliary support portion 23, and second auxiliary support portion 24 are vertically inserted into slit 11, first auxiliary slit 12, and second auxiliary slit 13, respectively. In this state, first electrodes 11a are soldered to second electrodes 22a, first auxiliary female electrodes 12a are soldered to first auxiliary male electrodes 23a, and second auxiliary female electrodes 13a are soldered to second auxiliary male electrodes 24a.

For example, the electrodes of main substrate 1 and rising substrate 2 transported by a conveyor with rising substrate 2 being attached to main substrate 1 are soldered with each other by a flow soldering method in which the electrodes are immersed in a molten solder jet and are soldered. Thereby, first electrodes 11a are soldered and fixed to second electrodes 22a, first auxiliary female electrodes 12a are soldered and fixed to first auxiliary male electrodes 23a, and second auxiliary female electrodes 13a are soldered and fixed to second auxiliary male electrodes 24a.

Next, the function and effect of the present embodiment will be described.

Also in the present embodiment, the same effect as that of the first embodiment described above can be obtained.

In addition, in printed wiring board 10 in the present embodiment, the dimensions of first auxiliary support portion 23 and first auxiliary slit 12 in the longitudinal direction of slit 11 are respectively larger than the dimensions of second auxiliary support portion 24 and second auxiliary slit 13 in the longitudinal direction of slit 11. This can prevent incorrect assembly in which first auxiliary support portion 23 and second auxiliary support portion 24 are reversely inserted into second auxiliary slit 13 and first auxiliary slit 12 when rising substrate 2 is inserted into main substrate 1. Therefore, printed wiring board 10 excellent in assembling property can be provided.

In addition, also in printed wiring board 10 in the present embodiment, support portion 22 is arranged to be spaced from the entire inner peripheral surface of slit 11. Thus, a strain generated in second electrodes 22a in support portion 22 is equalized. Thereby, a life until a solder joint ruptures is prolonged, when compared with a case where one end of support portion 22 contacts slit 11. Therefore, printed wiring board 10 having high reliability until a solder joint ruptures can be provided.

In addition, in printed wiring board 10 in the present embodiment, the surface area of first auxiliary female electrode 12a is larger than the surface area of each of the plurality of first electrodes 11a, and the surface area of first auxiliary male electrode 23a is larger than the surface area of each of the plurality of second electrodes 22a. Further, the surface area of second auxiliary female electrode 13a is larger than the surface area of each of the plurality of first electrodes 11a, and the surface area of second auxiliary male electrode 24a is larger than the surface area of each of the plurality of second electrodes 22a. Thus, bonding strength can be enhanced by increasing the amount of solder of a solder joint.

In addition, second auxiliary female electrode 13a of main substrate 1 and second auxiliary male electrode 24a of rising substrate 2 are electrodes provided at both ends where the maximum strain is applied. Thus, a strain generated due to the difference in linear expansion coefficient between main substrate 1 and rising substrate 2 can be reduced. Therefore, all solder joints provided in support portion 22 can have a prolonged life. Accordingly, printed wiring board 10 having further improved reliability can be obtained.

In addition, a defect of misalignment between first electrode 11a of main substrate 1 and second electrode 22a of rising substrate 2 can also be prevented by improving a self alignment effect obtained by enlarging second auxiliary female electrode 13a of main substrate 1 and second auxiliary male electrode 24a of rising substrate 2. Therefore, a printed wiring board having improved quality can be obtained. The self alignment effect is a function in which misalignment of an electronic component mounted on an electrode is corrected by the surface tension of molten solder on the electrode. As the electrode is larger, the surface tension is larger, resulting in an improved self alignment effect.

Fourth Embodiment

A fourth embodiment of the present invention includes the same components as those in the first embodiment of the present invention described above, unless otherwise specified. Thus, identical elements will be designated by the same reference numerals, and the description thereof will not be repeated.

A configuration of printed wiring board 10 in the fourth embodiment of the present invention will be described with reference to FIGS. 46 to 54.

Figure 46:
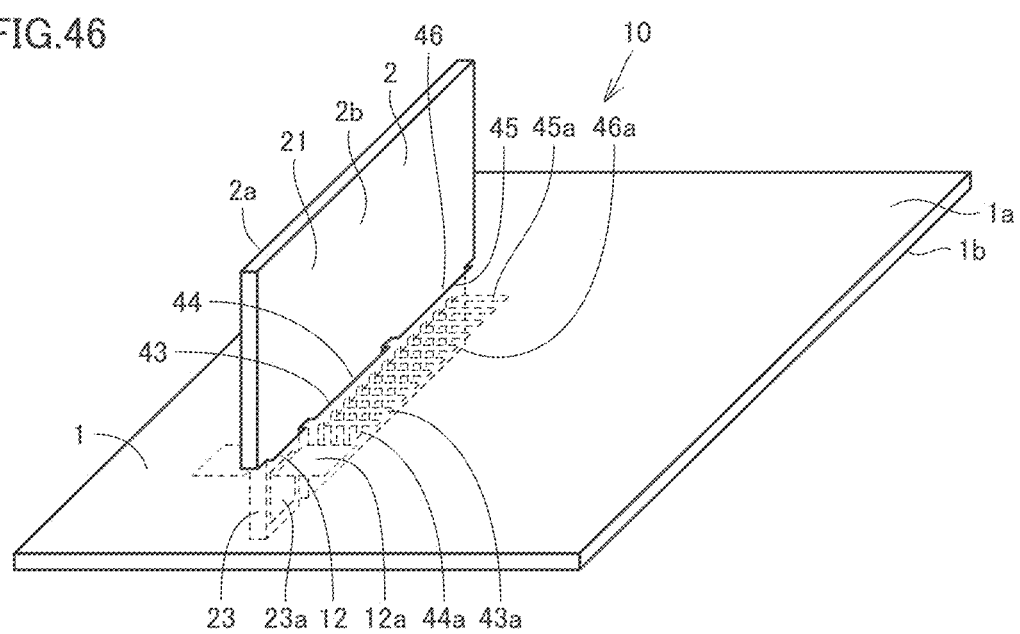
FIG. 46 is a perspective view schematically showing a configuration in which a rising substrate is mounted in a main substrate in a fourth embodiment of the present invention.
Figure 47:
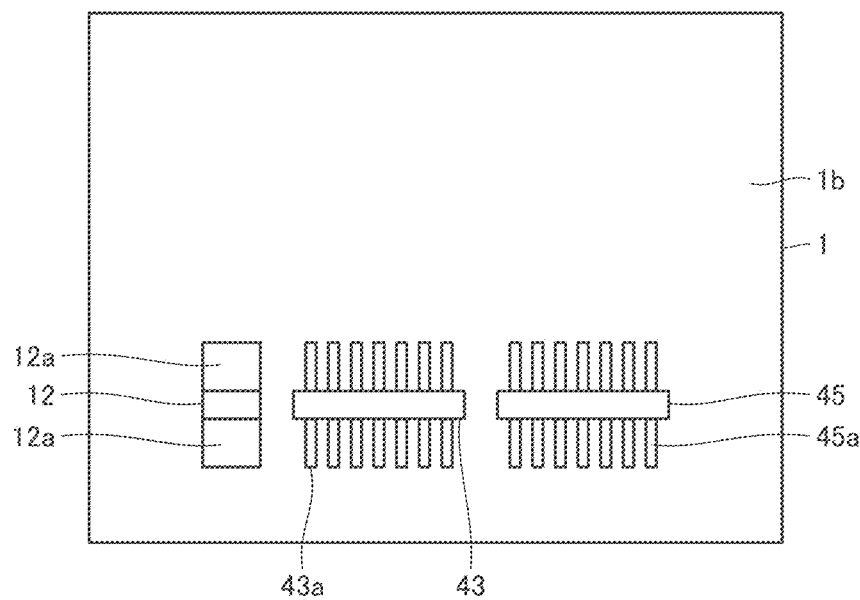
FIG. 47 is a bottom view schematically showing a configuration of the main substrate in the fourth embodiment of the present invention.

As shown in FIGS. 46 and 47, main substrate 1 has first auxiliary slit 12 and two first auxiliary female electrodes 12a. First auxiliary slit 12 is provided to penetrate from top surface 1a to bottom surface 1b of main substrate 1. First auxiliary slit 12 is arranged on one side of a first slit 43 and a second slit 45. First auxiliary slit 12 is arranged to be linearly aligned with a first slit 43 and a second slit 45 in the longitudinal direction of a first slit 43 and a second slit 45. First auxiliary slit 12 is provided at a position corresponding to first auxiliary support portion 23 described later.

Two first auxiliary female electrodes 12a are provided on bottom surface 1b of main substrate 1. Two first auxiliary female electrodes 12a are arranged with first auxiliary slit 12 being sandwiched therebetween in the short direction of first auxiliary slit 12.

Figure 48:
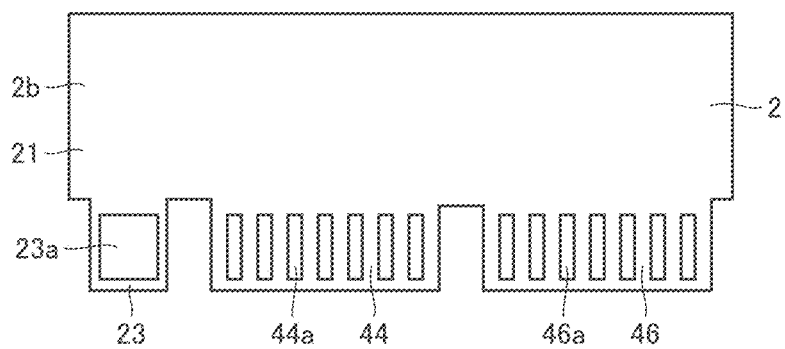
FIG. 48 is a front view schematically showing a configuration of the rising substrate in the fourth embodiment of the present invention.

As shown in FIGS. 46 and 48, rising substrate 2 has first auxiliary support portion 23 and two first auxiliary male electrodes 23a. First auxiliary support portion 23 is provided to protrude downward from body portion 21 at the lower portion of rising substrate 2. Two first auxiliary male electrodes 23a are provided in first auxiliary support portion 23. Two first auxiliary male electrodes 23a are provided on both of front surface 2a and rear surface 2b of rising substrate 2.

The surface area of first auxiliary female electrode 12a is larger than the surface area of each of the plurality of first electrodes 11a. In the present embodiment, first electrodes 11a include first slit female electrodes 43a and second slit female electrodes 45a. The surface area of first auxiliary male electrode 23a is larger than the surface area of each of the plurality of second electrodes 22a. In the present embodiment, second electrodes 22a include first support portion male electrodes 44a and second support portion male electrodes 46a.

First auxiliary support portion 23 is inserted into first auxiliary slit 12. In this state, two first auxiliary male electrodes 23a are soldered to two first auxiliary female electrodes 12a, respectively. A first support portion 44 is arranged to be spaced from an entire inner peripheral surface of first slit 43. A second support portion 46 is arranged to be spaced from an entire inner peripheral surface of second slit 45. Dimensions of first support portion 44 and first slit 43 in a longitudinal direction of first slit 43 are respectively larger than dimensions of first auxiliary support portion 23 and first auxiliary slit 12 in the longitudinal direction of first slit 43. Dimensions of second support portion 46 and second slit 45 in the longitudinal direction of first slit 43 are respectively larger than the dimensions of first auxiliary support portion 23 and first auxiliary slit 12 in the longitudinal direction of first slit 43.

The width of first support portion male electrode 44a and second support portion male electrode 46a of rising substrate 2, the width of first slit female electrode 43a and second slit female electrode 45a of main substrate 1, and the like will be described in further detail with reference to FIGS. 49 to 54.

Figure 49:
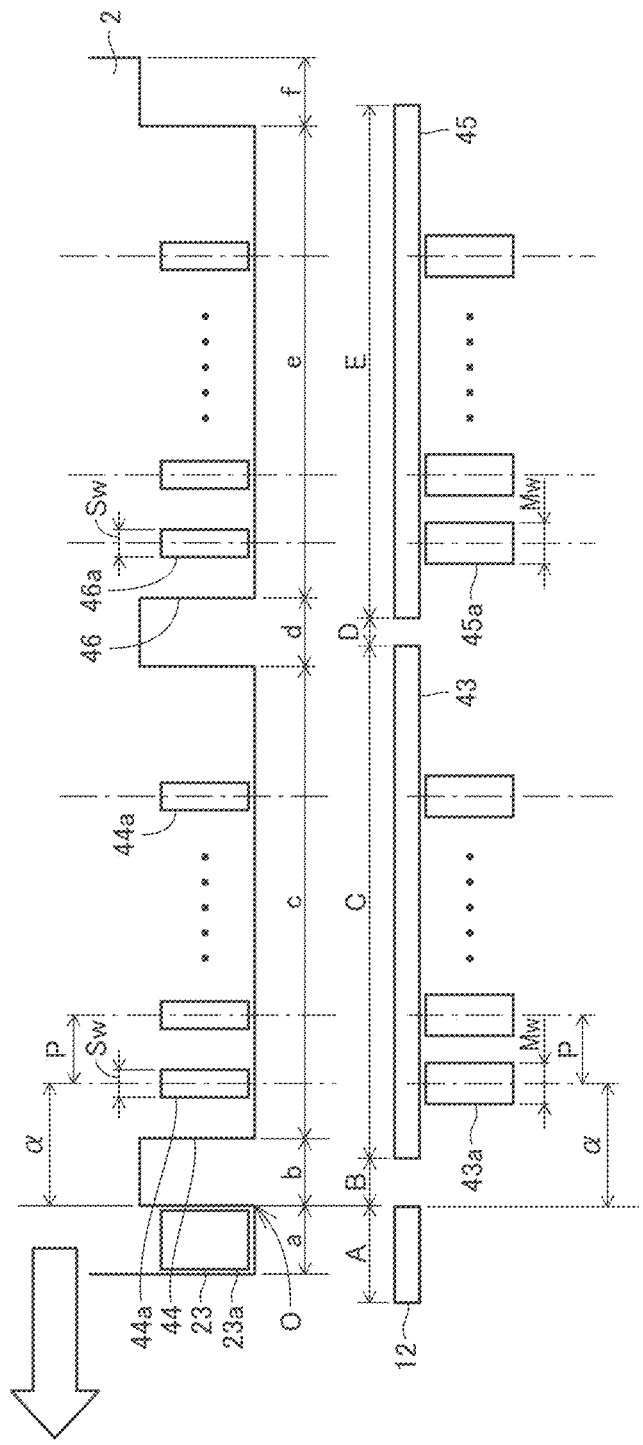
FIG. 49 is a schematic view for illustrating a configuration of the main substrate and the rising substrate having design values in the fourth embodiment of the present invention.
Figure 50:
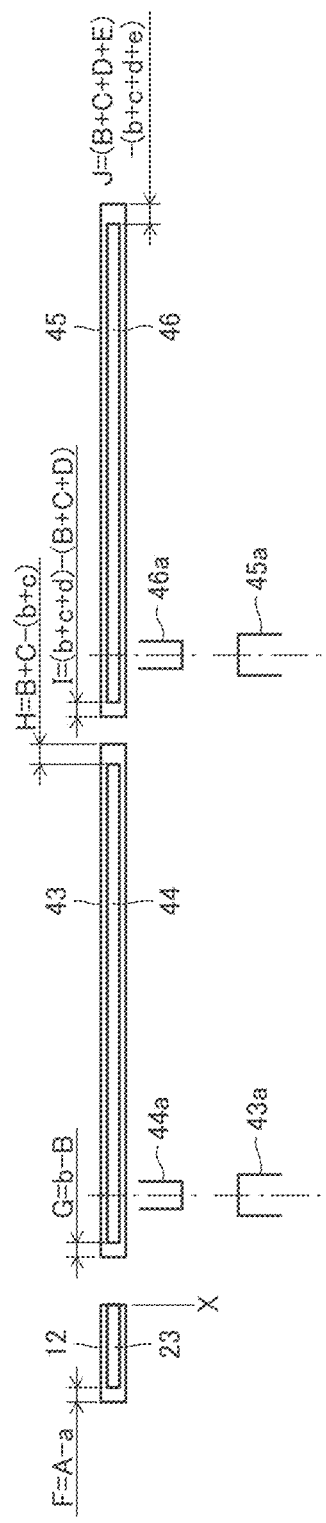
FIG. 50 is a schematic view for illustrating a configuration of a slit and a support portion having design values in the fourth embodiment of the present invention.

As shown in FIGS. 49 and 50, the width and the position of each of first support portion male electrode 44a and first slit female electrode 43a are designed such that, based on a certain determined origin O, the center of first support portion male electrode 44a matches the center of first slit female electrode 43a. At the same time, the width and the position of each of second support portion male electrode 46a and second slit female electrode 45a are designed such that, based on certain determined origin O, the center of second support portion male electrode 46a matches the center of second slit female electrode 45a. Origin O is, for example, a position where first auxiliary support portion 23 overlaps with first auxiliary slit 12 on a rear side in a flow direction.

In any of a combination in which rising substrate 2 has a maximum dimension and main substrate 1 has a minimum dimension and a combination in which rising substrate 2 has a minimum dimension and main substrate 1 has a maximum dimension, which are caused by dimensional tolerances, first support portion 44 does not contact first slit 43, and at the same time, second support portion 46 does not contact second slit 45, even if rising substrate 2 is misaligned within a first slit 43 and a second slit 45 during mounting.

In any of the combination in which rising substrate 2 has the maximum dimension and main substrate 1 has the minimum dimension and the combination in which rising substrate 2 has the minimum dimension and main substrate 1 has the maximum dimension, the electrode of main substrate 1 reliably overlaps with the electrode of rising substrate 2 by any of the width of the electrode of main substrate 1 and the width of the electrode of rising substrate 2, even if rising substrate 2 is misaligned within a first slit 43 and a second slit 45 during mounting.

Here, details of each design value thereof will be described.

First, a case where the substrates have design values (nominal values) will be described with reference to FIGS. 49 and 50.

As shown in FIG. 49, width Mw of first slit female electrode 43a and second slit female electrode 45a and width Sw of first support portion male electrode 44a and second support portion male electrode 46a have a relation Mw>Sw. Portions of rising substrate 2 have dimensions a, b, c, d, e, and f, where a is a width of first auxiliary support portion 23, b is a spacing between first auxiliary support portion 23 and first support portion 44, c is a width of first support portion 44, d is a spacing between first support portion 44 and second support portion 46, e is a width of second support portion 46, and f is a width of body portion 21 protruding from second support portion 46 on the other end side of rising substrate 2. Here, c and e are set to less than or equal to 65 mm. Portions of main substrate 1 have dimensions A, B, C, D, and E, where A is a width of first auxiliary slit 12, B is a spacing between first auxiliary slit 12 and first slit 43, C is a width of first slit 43, D is a spacing between first slit 43 and second slit 45, and E is a width of second slit 45.

First slit female electrode 43a and first support portion male electrode 44a are designed such that, when rising substrate 2 is caused to flow by jet solder during flow soldering and first auxiliary support portion 23 contacts first auxiliary slit 12 at an X portion, the center of first slit female electrode 43a of main substrate 1 matches the center of first support portion male electrode 44a of rising substrate 2, at a position having distance α from the origin. Further, second slit female electrode 45a and second support portion male electrode 46a are designed such that, on this occasion, the center of second slit female electrode 45a of main substrate 1 matches the center of second support portion male electrode 46a of rising substrate 2. First slit female electrodes 43a and first support portion male electrodes 44a are designed to be aligned at pitch P. Further, second slit female electrodes 45a and second support portion male electrodes 46a are also designed to be aligned at pitch P. On this occasion, as shown in FIG. 50, a gap between first auxiliary slit 12 and first auxiliary support portion 23 is indicated by F. Gaps between first slit 43 and first support portion 44 on one side and the other side are indicated by G and H. Gaps between second slit 45 and second support portion 46 on one side and the other side are indicated by I and J.

Figure 51:
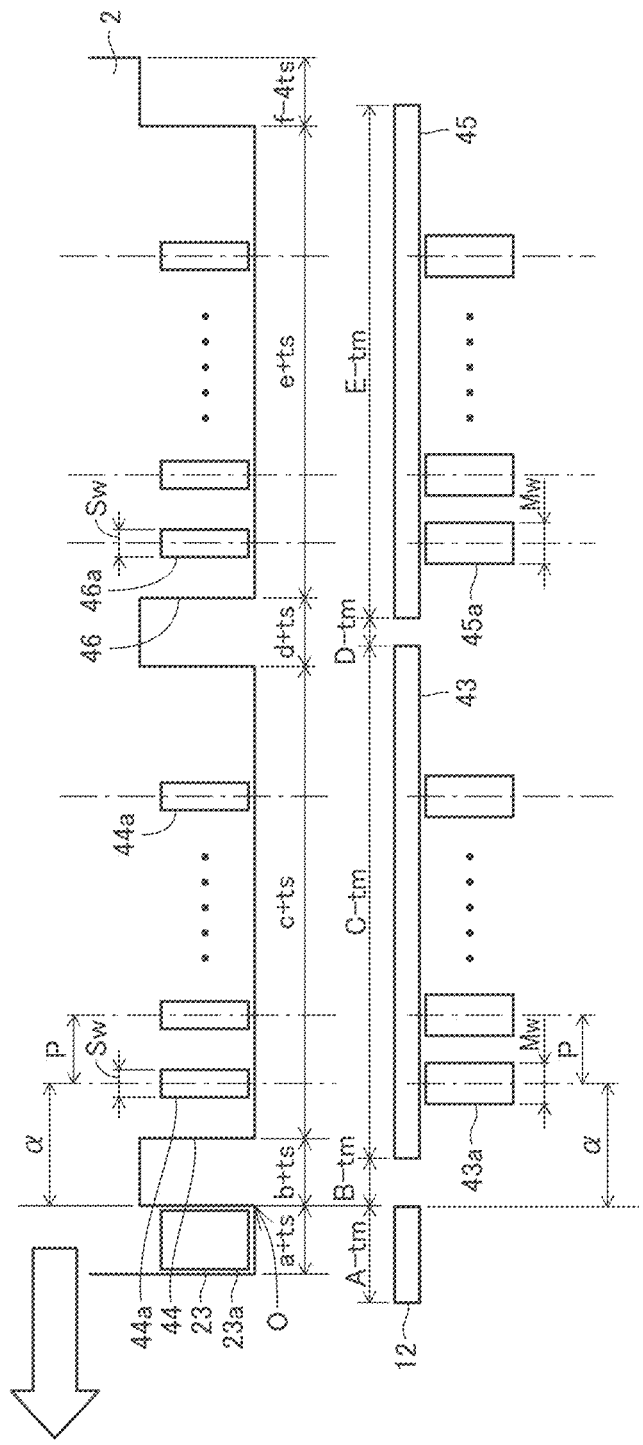
FIG. 51 is a schematic view for illustrating a configuration in which the rising substrate has a maximum dimension and the main substrate has a minimum dimension in the fourth embodiment of the present invention.

Next, a case where rising substrate 2 has the maximum dimension and main substrate 1 has the minimum dimension will be described with reference to FIGS. 51 and 52.

Values of plus/minus tolerances in processing rising substrate 2 and a first slit 43 and a second slit 45 are indicated by ts and tm, respectively. On this occasion, each portion has a dimension as shown in FIG. 51.

Here, the tolerance in forming the electrodes during manufacturing of the substrates is neglected, and it is assumed that the values of α, Sw, Mw, and P remain unchanged. Thus, when rising substrate 2 is caused to flow by a jet during flow soldering and contacts first auxiliary slit 12 at X portion, the center of first support portion male electrode 44a of rising substrate 2 matches the center of first slit female electrode 43a of main substrate 1, at a position having distance α from origin O. Further, on this occasion, the center of second slit female electrode 45a of main substrate 1 matches the center of second support portion male electrode 46a of rising substrate 2.

Figure 52:
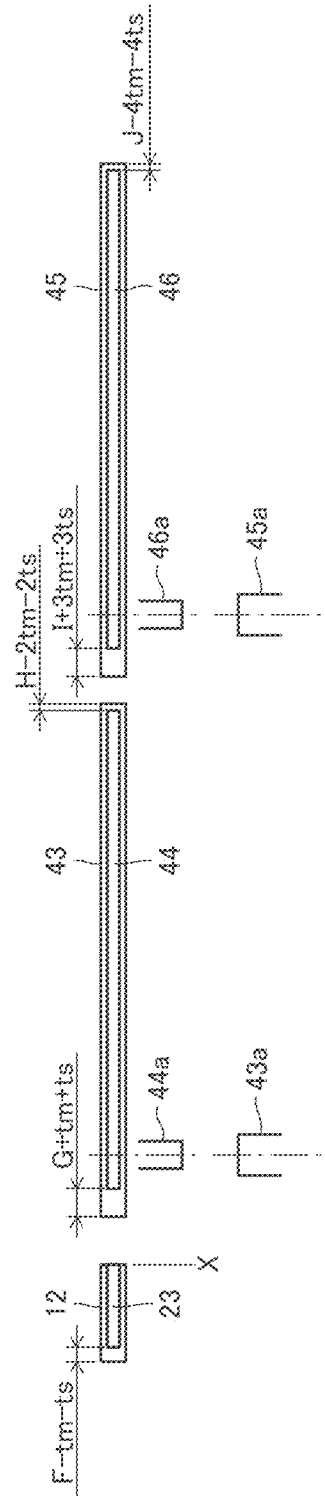
FIG. 52 is a schematic view for illustrating a configuration of the slit and the support portion in the configuration in which the rising substrate has the maximum dimension and the main substrate has the minimum dimension in the fourth embodiment of the present invention.

On this occasion, the gaps are indicated by F, G, H, I, and J shown in FIG. 52.

When the values of G+ts+tm and I+3ts+3tm are more than the value of F−tm−ts, end portions of first support portion 44 have no contact within first slit 43, and at the same time, end portions of second support portion 46 have no contact within second slit 45, even if rising substrate 2 is misaligned within first slit 43 and second slit 45.

Further, when the value of (Mw−Sw)/2 is more than or equal to the value of F−tm−ts, first electrode 11a can reliably overlap with second electrode 22a by the width of Sw even if rising substrate 2 is misaligned within a first slit 43 and a second slit 45.

When the above relation is expressed by expressions, expressions (12) and (13) are obtained:

$$G+ts+tm > (Mw-Sw)/2 \geq F-tm-ts \quad (12);$$

$$I+3ts+3tm > (Mw-Sw)/2 \geq F-tm-ts \quad (13).$$

Next, a case where rising substrate 2 has the minimum dimension and main substrate 1 has the maximum dimension will be described with reference to FIGS. 53 and 54.

Figure 53:
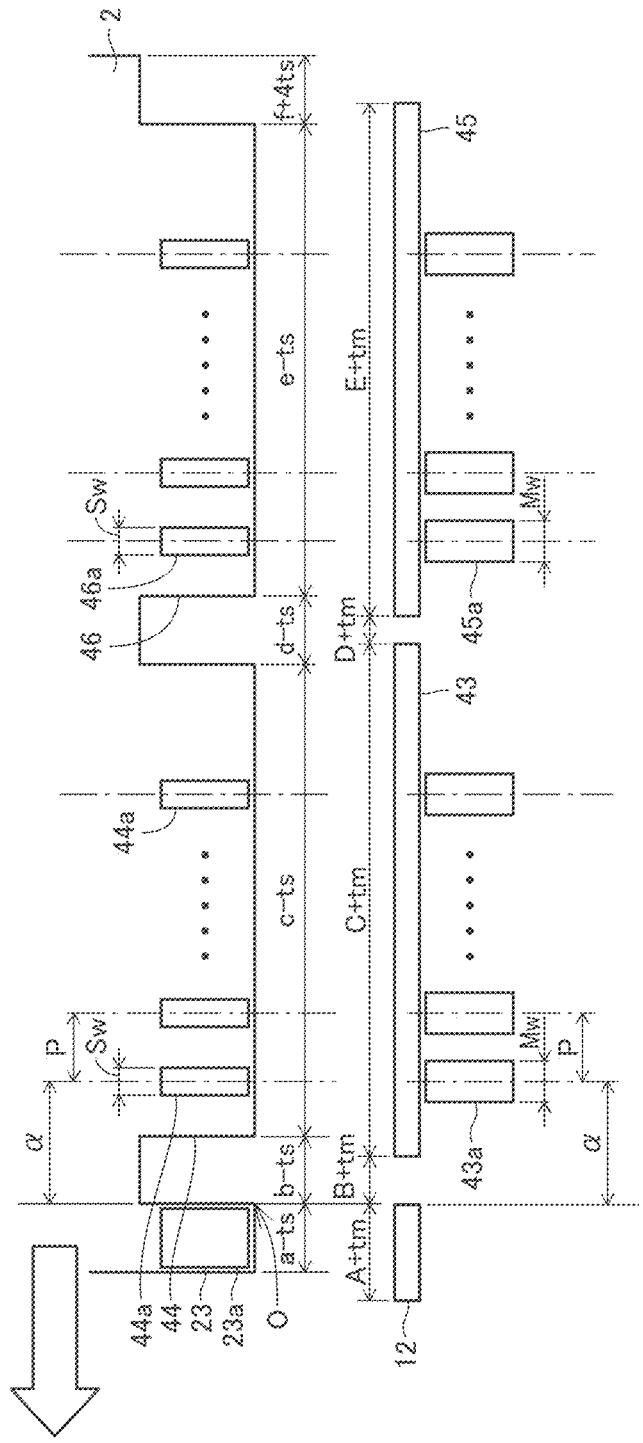
FIG. 53 is a schematic view for illustrating a configuration in which the rising substrate has a minimum dimension and the main substrate has a maximum dimension in the fourth embodiment of the present invention.

On this occasion, each portion has a dimension as shown in FIG. 53.

Here, the tolerance in forming the electrodes during manufacturing of the substrates is neglected, and it is assumed that the values of α, Sw, Mw, and P remain unchanged. Thus, when rising substrate 2 is caused to flow by a jet during flow soldering and contacts first auxiliary slit 12 at X portion, the center of first support portion male electrode 44a of rising substrate 2 matches the center of first slit female electrode 43a of main substrate 1, at a position having distance α from origin O. Further, on this occasion, the center of second slit female electrode 45a of main substrate 1 matches the center of second support portion male electrode 46a of rising substrate 2.

Figure 54:
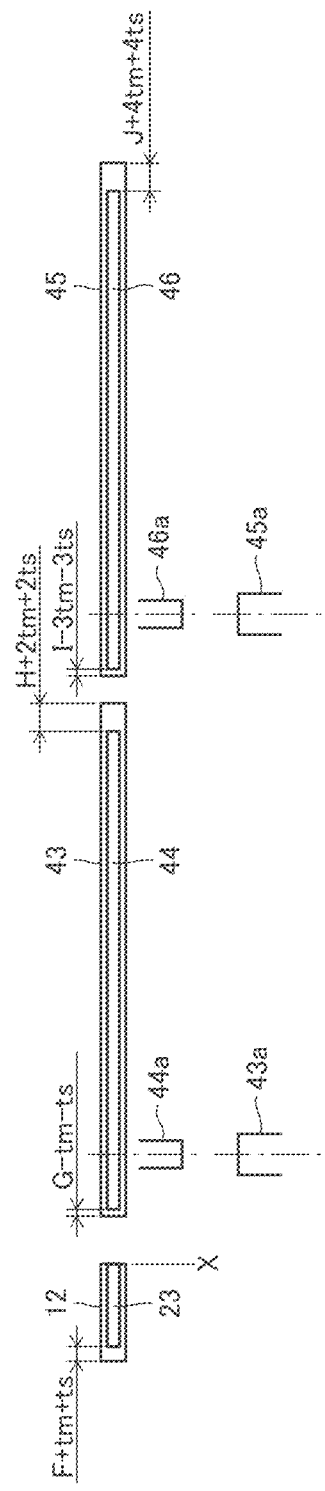
FIG. 54 is a schematic view for illustrating a configuration of the slit and the support portion in the configuration in which the rising substrate has the minimum dimension and the main substrate has the maximum dimension in the fourth embodiment of the present invention.

On this occasion, the gaps are indicated by F, G, and H shown in FIG. 54.

When the value of G−ts−tm and the value of I−3tm−3ts are more than the value of F+tm+ts, end portions of first support portion 44 and second support portion 46 (support portion 22) have no contact within a first slit 43 and a second slit 45 even if rising substrate 2 is misaligned within a first slit 43 and a second slit 45.

Further, when the value of (Mw−Sw)/2 is more than or equal to the value of F+tm+ts, first electrode 11a can reliably overlap with second electrode 22a by the width of Sw even if rising substrate 2 is misaligned within a first slit 43 and a second slit 45.

When the above relation is expressed by expressions, expressions (14) and (15) are obtained:

$$G-ts-tm>(Mw-Sw)/2 \geq F+tm+ts \quad (14);$$

$$I-3tm-3ts>(Mw-Sw)/2 \geq F+tm+ts \quad (15).$$

In order to satisfy both expressions (12) and (14), it is only necessary to satisfy expression (14).

In order to satisfy both expressions (13) and (15), it is only necessary to satisfy expression (15).

Here, it is generally satisfactory to assume that the tolerance in forming the electrodes during manufacturing of the substrates, which is neglected above, is more than or equal to 0.05 mm.

Thus, when the above relation is expressed by expressions, the present embodiment satisfies expressions (16) and (17):

$$G-ts-tm>(Mw-Sw)/2 \geq F+tm+ts \geq 0.05 \quad (16);$$

$$I-3tm-3ts>(Mw-Sw)/2 \geq F+tm+ts \geq 0.05 \quad (17).$$

Next, a method for manufacturing the printed wiring board in the present embodiment will be described with reference to FIG. 46.

As shown in FIG. 46, first support portion 44, second support portion 46, and first auxiliary support portion 23 are vertically inserted into first slit 43, second slit 45, and first auxiliary slit 12, respectively. In this state, first slit female electrodes 43a are soldered to first support portion male electrodes 44a, second slit female electrodes 45a are soldered to second support portion male electrodes 46a, and first auxiliary female electrodes 12a are soldered to first auxiliary male electrodes 23a.

For example, the electrodes of main substrate 1 and rising substrate 2 transported by a conveyor with rising substrate 2 being attached to main substrate 1 are soldered with each other by a flow soldering method in which the electrodes are immersed in a molten solder jet and are soldered. Thereby, first slit female electrodes 43a are soldered and fixed to first support portion male electrodes 44a, second slit female electrodes 45a are soldered and fixed to second support portion male electrodes 46a, and first auxiliary female electrodes 12a are soldered and fixed to first auxiliary male electrodes 23a.

Next, the function and effect of the present embodiment will be described.

Also in the present embodiment, the same effect as those of the first to third embodiments described above can be obtained.

In addition, in printed wiring board 10 in the present embodiment, the dimension of first slit 43 and the dimension of second slit 45 are set to less than or equal to 65 mm. In this case, warping of main substrate 1 due to heat input during immersion in flow solder can be prevented, and thus a solder joint having a larger volume can be formed. Thereby, a life until the solder joint ruptures is prolonged. It should be noted that the inventors have confirmed through experiments that, when the dimensions of first slit 43 and second slit 45 are set to less than or equal to 65 mm, the life is prolonged about twice or more when compared with a case where the dimensions thereof are set to less than or equal to 90 mm. Therefore, a printed wiring board having high reliability until a solder joint ruptures can be provided.

In addition, in printed wiring board 10 in the present embodiment, the surface area of first auxiliary female electrode 12a is larger than the surface area of each of the plurality of first electrodes 11a, and the surface area of first auxiliary male electrode 23a is larger than the surface area of each of the plurality of second electrodes 22a. Thus, bonding strength can be enhanced by increasing the amount of solder of a solder joint.

Next, various variations of the present embodiment will be described. Although the present embodiment has described a case where first auxiliary support portion 23 and first auxiliary slit 12 are arranged on a front side in the flow direction, first auxiliary support portion 23 and first auxiliary slit 12 may be arranged on a rear side in the flow direction.

In addition, other variations of the present embodiment will be described. Although the present embodiment has described a case where two slits are provided in main substrate 1 and two support portions are provided in rising substrate 2, two or more slits and two or more support portions may be provided.

EXAMPLE

Hereinafter, an example of the present invention will be described. Since the present example includes the same components as those in the first to third embodiments of the present invention described above unless otherwise specified, identical elements will be designated by the same reference numerals, and the description thereof will not be repeated.

First, regarding Examples 1 and 2 of the present invention, the amount of solder forming each electrode pad was measured.

TABLE 1

|  | Mw (mm) | Sw (mm) |
|---|---|---|
| Example 1 | 1.3 | 1.6 |
| Example 2 | 1.6 | 1.3 |

As shown in Table 1, in Example 1, width Mw of each of the plurality of first electrodes 11a is 1.3 mm, and width Sw of the plurality of second electrodes 22a is 1.6 mm. That is, width Mw of each of the plurality of first electrodes 11a is smaller than width Sw of each of the plurality of second electrodes 22a.

In addition, in Example 2, width Mw of each of the plurality of first electrodes 11a is 1.6 mm, and width Sw of the plurality of second electrodes 22a is 1.3 mm. That is, width Mw of each of the plurality of first electrodes 11a is larger than width Sw of each of the plurality of second electrodes 22a.

Further, width Mw of each of the plurality of first electrodes 11a in Example 1 is equal to width Sw of the plurality of second electrodes 22a in Example 2. In addition, width Sw of each of the plurality of second electrodes 22a in Example 1 is equal to width Mw of each of the plurality of first electrodes 11a in Example 2.

It should be noted that, in Examples 1 and 2, the base material, the solder composition, the length of the rising substrate, and the slit in the main substrate are identical. Specifically, the solder composition is Sn-3.0Ag-0.5Cu.

Figure 43:
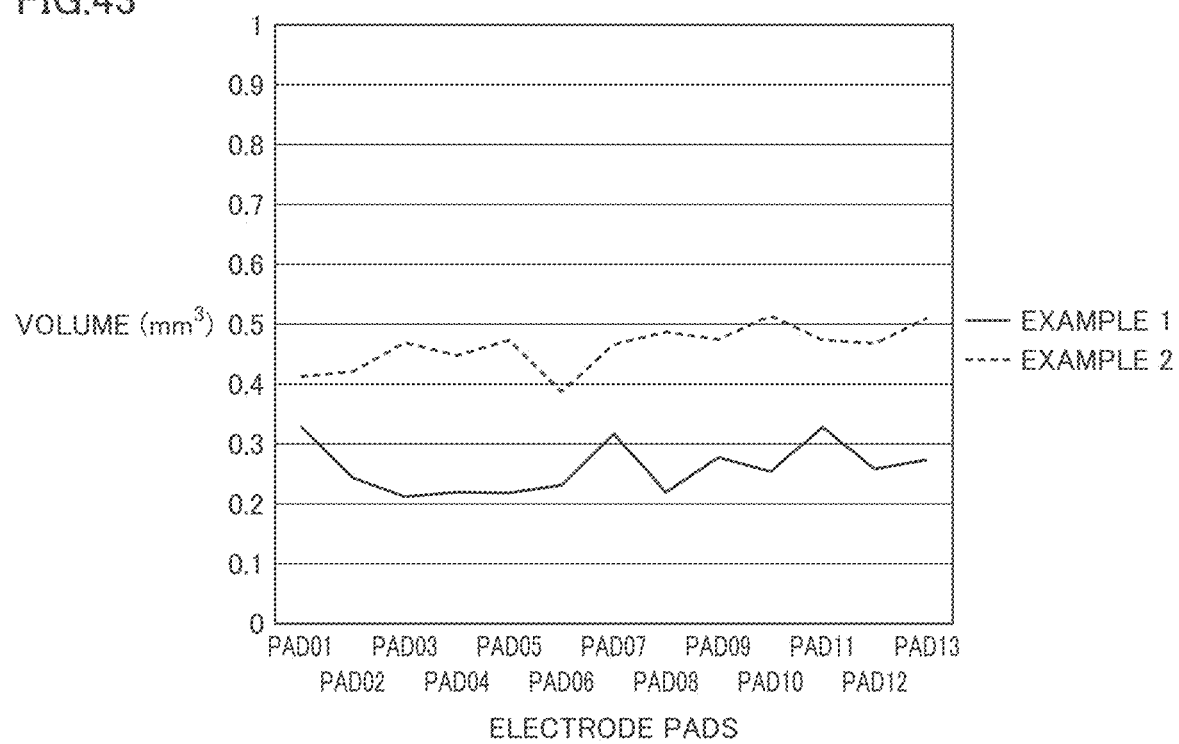
FIG. 43 is a view showing the amounts of solder forming electrode pads in Examples 1 and 2.

FIG. 43 shows the volumes (mm$^3$) of amounts of solder forming electrode pads (PAD01 to PAD13) in each of Examples 1 and 2. As shown in FIG. 43, it was found that the amount of solder forming each electrode pad in Example 2 was larger than that in Example 1. Thereby, it was found that the amount of solder forming each electrode pad is larger when width Mw of each of the plurality of first electrodes 11a is larger than width Sw of each of the plurality of second electrodes 22a.

This is considered to be because of the following reason. When width Sw of the electrode of a sub substrate is shorter, the exposed surface area of the electrode of the sub substrate is smaller. This can suppress the solder adhering to the electrodes of the substrates from being taken out by a solder jet in the direction in which the substrates move, when the substrates leave a flow bath.

Next, the situation of rupture in a vapor phase temperature cycle test was inspected under a condition in which temperature was changed from −55° C. to +125° C.

TABLE 2

|  | Number of Samples | Number of NG Samples (in which rupture occurred in less than 2,000 cycles) |
| --- | --- | --- |
| Example 1 | 28 | 3 |
| Example 2 | 28 | 0 |

As shown in Table 2, the number of samples is 28 in both Examples 1 and 2. The number of samples in which rupture occurred in less than 2000 cycles is referred to as the number of NG samples. As shown in Table 2, the number of NG samples in Example 2 was smaller than that in Example 1. Therefore, it was found that the life in Example 2 is longer than that in Example 1.

Accordingly, as the amount of solder forming a solder joint becomes larger, the life until the solder joint ruptures can be prolonged. In addition, when width Mw of the first electrode is larger than width Sw of the second electrode, the amount of solder forming the solder joint between the electrodes becomes larger. Therefore, to prolong the life of the solder joint, it is preferable that width Mw of the first electrode is larger than width Sw of the second electrode.

Furthermore, effects other than those described above will be described. By adopting the present embodiment in which the width of either second electrode 22a or first electrode 11a is shortened, it is possible to prevent a bridge induced by the misalignment of rising substrate 2 within the slit during soldering. This is because, by shortening the width of one electrode, the one electrode can keep a distance from an electrode of the other substrate adjacent to an electrode to which the one electrode is to be soldered.

In contrast, when both the width of second electrode 22a and the width of first electrode 11a are lengthened and first electrodes 11a and second electrodes 22a are aligned at the same pitch, the distance between one electrode and an electrode of the other substrate adjacent to an electrode to which the one electrode is to be soldered becomes shorter, and thereby a bridge is easily generated. This phenomenon is significant when the pitch between the electrodes is shortened for greater density. Therefore, by adopting the configuration shown in the present embodiment, a bridge can be suppressed and the pitch between the electrodes can be shortened, which can also contribute to greater density.

It should be understood that the embodiments disclosed herein are illustrative and non-restrictive in every respect. The scope of the present invention is defined by the scope of the claims, rather than the description above, and is intended to include any modifications within the scope and meaning equivalent to the scope of the claims.

REFERENCE SIGNS LIST

1: main substrate; 1a: top surface; 1b: bottom surface; 2: rising substrate; 2a: front surface; 2b: rear surface; 10: printed wiring board; 11: slit; 11a: first electrode; 12: first auxiliary slit; 12a: first auxiliary female electrode; 13: second auxiliary slit; 13a: second auxiliary female electrode; 21: body portion; 22: support portion; 22a: second electrode; 23: first auxiliary support portion; 23a: first auxiliary male electrode; 24: second auxiliary support portion; 24a: second auxiliary male electrode; 30: bridge prevention line; 41: first relief-processed portion; 42: second relief-processed portion; 43: first slit; 43a: first slit female electrode; 44: first support portion; 44a: first support portion male electrode; 45: second slit; 45a: second slit female electrode; 46: second support portion; 46a: second support portion male electrode.

The invention claimed is:
1. A printed wiring board comprising:
   a main substrate having a top surface, a bottom surface, a slit penetrating from the top surface to the bottom surface, and a plurality of first electrodes provided on the bottom surface; and
   a rising substrate having a support portion and a plurality of second electrodes provided in the support portion and connected to the plurality of first electrodes, respectively, using solder,
   the support portion of the rising substrate being inserted into the slit in the main substrate,
   in a direction in which the plurality of first electrodes are aligned, a width of each of the plurality of first electrodes being larger than a width of each of the plurality of second electrodes, the width of each of the plurality of second electrodes being arranged to fit within the width of each of the plurality of first electrodes,
   each of the plurality of second electrodes of the rising substrate being inserted into the slit in the main substrate,
   the solder being arranged between the rising substrate and an inner peripheral surface of the slit in the main substrate wherein, with the support portion of the rising substrate being inserted into the slit in the main substrate, the plurality of first electrodes and the plurality of second electrodes are connected using solder, and the solder is formed on the bottom surface of the main substrate.

2. The printed wiring board according to claim 1, wherein the support portion is arranged to be spaced from an entirety of the inner peripheral surface of the slit.

3. The printed wiring board according to claim 1, wherein at least one of a symbol ink and a solder resist is arranged between the plurality of second electrodes.

4. The printed wiring board according to claim 1, wherein
   a first relief-processed portion is provided at each of four corners of the slit along the top surface of the main substrate, and
   the first relief-processed portion has an arc shape spreading toward an outside of the slit along the top surface.

5. The printed wiring board according to claim 1, wherein
the rising substrate includes a body portion connected to the support portion and protruding on one side and another side of the support portion,
second relief-processed portions are provided at a connection portion between the support portion and the body portion on the one side and the other side of the support portion,
the second relief-processed portion on the one side has an arc shape spreading toward the other side, and
the second relief-processed portion on the other side has an arc shape spreading toward the one side.

6. The printed wiring board according to claim 1, wherein
a pitch P between the plurality of first electrodes and between the plurality of second electrodes,
one larger width Mw and another smaller width Sw of each of the plurality of first electrodes and each of the plurality of second electrodes, and
a value D obtained by subtracting a length of the support portion from a length of the slit in a direction in which the slit extends
have a relation $P/2 > (Mw - Sw)/2 \geq D$.

7. The printed wiring board according to claim 1, wherein, with the support portion of the rising substrate being inserted into the slit in the main substrate, the plurality of second electrodes extend to a height of the top surface of the main substrate.

8. The printed wiring board according to claim 1, wherein two slits and two support portions are provided.

9. The printed wiring board according to claim 1, wherein
the main substrate has a first auxiliary slit penetrating from the top surface to the bottom surface, and two first auxiliary female electrodes provided on the bottom surface,
the first auxiliary slit is arranged to be linearly aligned with the slit in a longitudinal direction of the slit,
the two first auxiliary female electrodes are arranged with the first auxiliary slit being sandwiched therebetween in a short direction of the first auxiliary slit,
the rising substrate has a first auxiliary support portion and two first auxiliary male electrodes provided in the first auxiliary support portion,
the first auxiliary support portion is inserted into the first auxiliary slit, and
the two first auxiliary male electrodes are soldered to the two first auxiliary female electrodes, respectively.

10. The printed wiring board according to claim 9, wherein dimensions of the support portion and the slit in the longitudinal direction of the slit are respectively larger than dimensions of the first auxiliary support portion and the first auxiliary slit in the longitudinal direction of the slit.

11. The printed wiring board according to claim 9, wherein a surface area of the first auxiliary female electrode is larger than a surface area of each of the plurality of first electrodes, and a surface area of the first auxiliary male electrode is larger than a surface area of each of the plurality of second electrodes.

12. The printed wiring board according to claim 1, wherein a height of upper ends of the plurality of second electrodes of the rising substrate is equal to or higher than the top surface of the main substrate.

* * * * *